United States Patent
Kwon

(10) Patent No.: US 9,318,569 B2
(45) Date of Patent: Apr. 19, 2016

(54) UNIT CELLS OF NONVOLATILE MEMORY DEVICES, CELL ARRAYS OF NONVOLATILE MEMORY DEVICES, AND METHODS OF FABRICATING THE SAME

(71) Applicant: SK hynix Inc., Gyeonggi-do (KR)

(72) Inventor: Young Joon Kwon, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/498,582

(22) Filed: Sep. 26, 2014

(65) Prior Publication Data

US 2016/0020292 A1   Jan. 21, 2016

(30) Foreign Application Priority Data

Jul. 17, 2014 (KR) ........................ 10-2014-0090238

(51) Int. Cl.
*H01L 27/115* (2006.01)
*H01L 29/423* (2006.01)
*H01L 29/792* (2006.01)

(52) U.S. Cl.
CPC .... *H01L 29/42348* (2013.01); *H01L 27/11563* (2013.01); *H01L 29/792* (2013.01)

(58) Field of Classification Search
CPC .................................................. H01L 27/1157
See application file for complete search history.

(56) References Cited

U.S. PATENT DOCUMENTS

| | | | |
|---|---|---|---|
| 2007/0085124 A1 | 4/2007 | Wong et al. | |
| 2010/0074013 A1* | 3/2010 | Joo .................... | G11C 16/0425 365/185.15 |
| 2011/0049609 A1* | 3/2011 | Nagai ................ | G11C 16/0466 257/324 |
| 2014/0293708 A1* | 10/2014 | Kwon .................. | H01L 29/792 365/185.23 |
| 2015/0303204 A1* | 10/2015 | Kwon ................. | H01L 27/1157 257/324 |

FOREIGN PATENT DOCUMENTS

KR   1020060015373   2/2006

* cited by examiner

*Primary Examiner* — Lex Malsawma
(74) *Attorney, Agent, or Firm* — IP & T Group LLP

(57) ABSTRACT

Unit cells including a substrate having an active region, a first charge trap pattern disposed on the substrate to intersect the active region, a second charge trap pattern disposed on the substrate to intersect the active region and spaced apart from the first charge trap pattern, a first junction region disposed in the active region between the first and second charge trap patterns, a second junction region disposed in the active region adjacent to one side of the first charge trap pattern opposite to the second charge trap pattern, and a third junction region disposed in the active region adjacent to one side of the second charge trap pattern opposite to the first charge trap pattern.

15 Claims, 23 Drawing Sheets

UNIT CELLS OF NONVOLATILE MEMORY DEVICES, CELL ARRAYS OF NONVOLATILE MEMORY DEVICES, AND METHODS OF FABRICATING THE SAME

CROSS-REFERENCE TO RELATED APPLICATION

The present application claims priority under 35 U.S.C 119(a) to Korean Application No. 10-2014-0090238, filed on Jul. 17, 2014, which is incorporated herein by reference in its entirety.

BACKGROUND

1. Technical Field

Various embodiments of the present disclosure relate to nonvolatile memory devices and methods of fabricating the same and, more particularly, to unit cells and cell arrays of nonvolatile memory devices and methods of fabricating the same.

2. Related Art

Semiconductor memory devices are typically categorized as volatile memory devices or nonvolatile memory devices. Volatile memory devices lose their stored data when their power supplies are interrupted but have relatively high operating speeds, for example, they read out data stored in memory cells or write data into the memory cells relatively quickly. In contrast, nonvolatile memory devices retain their stored data when their power supplies are interrupted but tend to operate at lower speeds. Therefore, nonvolatile memory devices are used in electronic systems that need to retain data without having a constant power source. Nonvolatile memory devices include mask read only memory (MROM) devices, programmable read only memory (PROM) devices, erasable programmable read only memory (EPROM) devices, electrically erasable programmable read only memory (EEPROM) devices, flash memory devices, etc.

In general, the MROM devices, the PROM devices, and the EPROM devices need additional equipment such as, a UV irradiator, to erase their stored data. Thus, it may be inconvenient to use MROM devices, PROM devices, and EPROM devices in many applications. In contrast, EEPROM devices and flash memory devices allow data to be electrically erased and written without additional equipment. Accordingly, EEPROM devices and flash memory devices may be applied in various areas, for example, systems for program executions or auxiliary memory devices necessitating frequent data renewals. In particular, flash memory devices may be simultaneously erased in units such as, in pages, and are capable of achieving higher integration densities than EEPROM devices. Therefore, flash memory devices are often used in large capacity auxiliary memory devices.

The amount of data that nonvolatile memory devices are capable of storing in each memory cell depends on the number of bits that are stored in each memory cell. A memory cell in which a single bit of data is stored is referred to as a single bit cell or a single level cell (SLC). In contrast, a memory cell in which multi-bit data, for example, data including two bits or more, is stored, is referred to as a multi-bit cell, a multi-level cell (MLC) or a multi-state cell. As semiconductor memory devices become more highly integrated, nonvolatile memory devices employing MLCs have garnered the attention of the semiconductor industry.

Flash memory and EEPROM devices generally have a stacked gate structure including a floating gate and a control gate electrode, which are vertically stacked. However, if the distance between the memory cells is reduced too much, threshold voltages of the memory cells may become unstable due to interference effects or coupling capacitances between the memory cells. Therefore, a lot of research and development goes into perfecting how memory devices can more effectively store data using charge trapping layers.

SUMMARY

Various embodiments are directed to unit cells and cell arrays of nonvolatile memory devices and methods of fabricating the same.

According to an embodiment, a unit cell of a nonvolatile memory device includes a substrate having an active region, a first charge trap pattern disposed on the substrate to intersect the active region, a second charge trap pattern disposed on the substrate to intersect the active region and spaced apart from the first charge trap pattern, a first junction region disposed in the active region between the first and second charge trap patterns, a second junction region disposed in the active region adjacent to one side of the first charge trap pattern opposite to the second charge trap pattern and spaced apart from the first junction region by a first planar channel region, and a third junction region disposed in the active region adjacent to one side of the second charge trap pattern opposite to the first charge trap pattern and spaced apart from the first junction region by a second planar channel region.

According to another embodiment, a unit cell of a nonvolatile memory device includes a first charge storage transistor and a second charge storage transistor. The first charge storage transistor includes a first charge trap pattern, a first junction region and a second junction region. The first charge trap pattern includes a first tunneling layer, a first charge trap layer, a first insulation layer and a first control gate layer which are sequentially stacked. The second charge storage transistor includes a second charge trap pattern, the first junction region and a third junction region. The second charge trap pattern includes a second tunneling layer, a second charge trap layer, a second insulation layer and second control gate layer which are sequentially stacked. The first charge storage transistor shares the first junction region with the second charge storage transistor. The first control gate layer and the second control gate layer are electrically connected to a first word line and a second word line, respectively. The first junction region is electrically connected to a source line, and the second and third junction regions are electrically connected to a bit line.

According to another embodiment, a cell array of a nonvolatile memory device includes a plurality of bit lines extending in a bit line direction, a plurality of word lines including odd-numbered word lines and even-numbered word lines that extend in a word line direction intersecting the bit line direction, a plurality of source lines extending in the word line direction, and a plurality of unit cells disposed at intersections of the bit lines and the source lines, respectively. Each of the unit cells includes a first charge storage transistor and a second charge storage transistor that are connected in series along the bit line direction to share a first junction region. Each of the first charge storage transistors includes a first control gate layer, the first junction region and a second junction region. Each of the second charge storage transistors includes a second control gate layer, the first junction region and a third junction region. The first control gate layer and the second control gate layer of each of the unit cells are electrically connected to one of the odd-numbered word lines and one of the even-numbered word lines, respectively. The second junction region and the third junction region of each of the unit cells are electrically connected to one of the bit lines.

The first junction region of each of the unit cells is electrically connected to one of the source lines.

According to another embodiment, a method of fabricating a nonvolatile memory device includes forming a fence pattern on a substrate. A tunneling layer, a charge trap layer and an insulation layer are sequentially formed on the substrate and the fence pattern. A control gate layer is formed on the insulation layer. The control gate layer, the insulation layer, the charge trap layer and the tunneling layer are anisotropically etched to form a first charge trap pattern on a first sidewall of the fence pattern and a second charge trap pattern on a second sidewall of the fence pattern opposite to the first charge trap pattern. The first charge trap pattern is formed to include a first tunneling layer, a first charge trap layer, a first insulation layer and a first control gate layer having a spacer-shaped cross section, and the second charge trap pattern is formed to include a second tunneling layer, a second charge trap layer, a second insulation layer and a second control gate layer having a spacer-shaped cross section. The fence pattern is removed to expose the substrate between the first and second charge trap patterns. A first junction region is formed in the substrate under a gap region between the first and second charge trap patterns, a second junction region is formed in the substrate adjacent to a sidewall of the first charge trap pattern opposite to the second charge trap pattern, and a third junction region is formed in the substrate adjacent to a sidewall of the second charge trap pattern opposite to the first charge trap pattern.

BRIEF DESCRIPTION OF THE DRAWINGS

Embodiments of the present disclosure will become more apparent in view of the attached drawings and accompanying detailed description, in which.

DETAILED DESCRIPTION OF THE EMBODIMENTS

Figure 1:
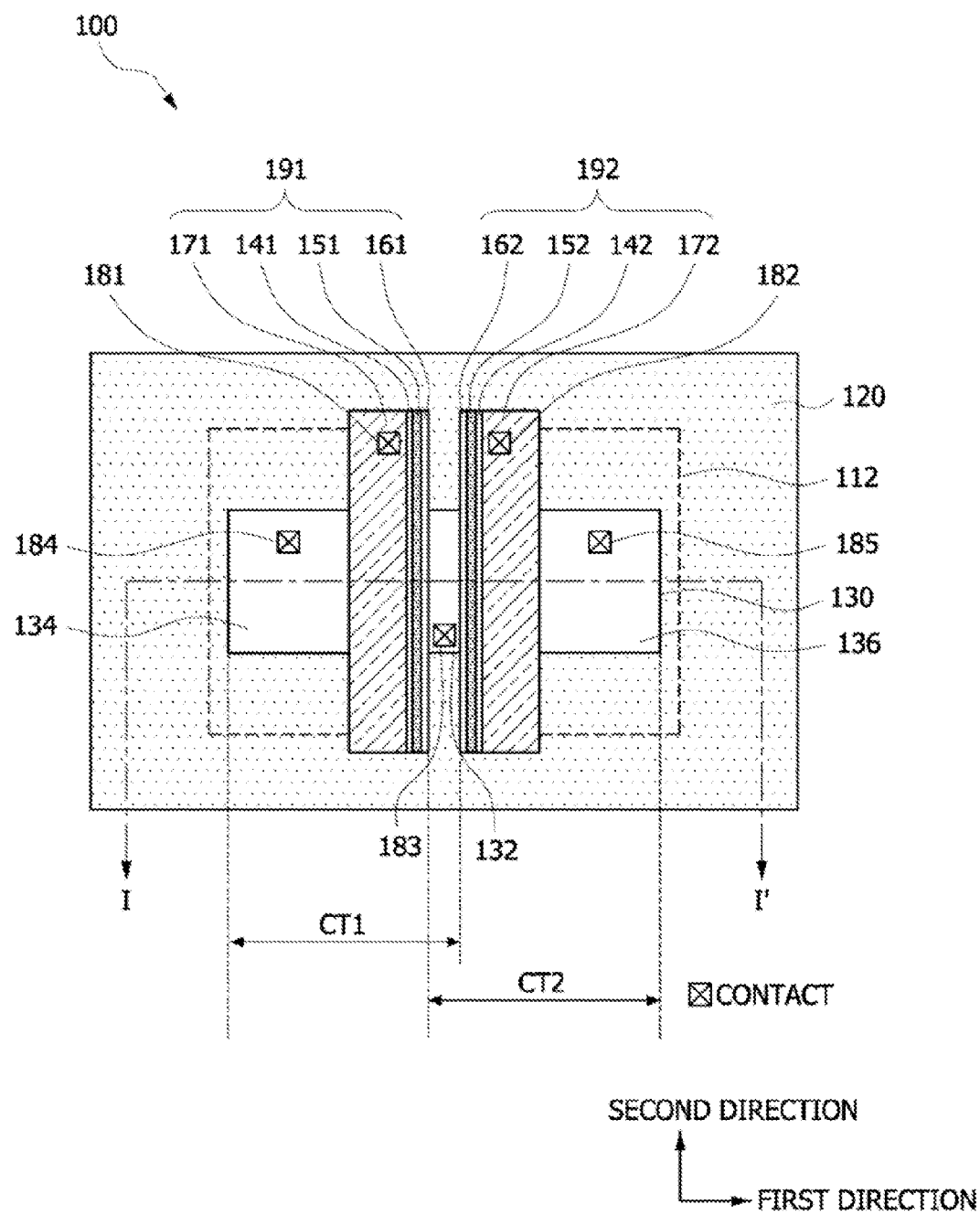
FIG. 1 is a layout diagram illustrating a unit cell of a nonvolatile memory device according to an embodiment.

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete, and will fully convey the scope to those skilled in the art. Throughout the disclosure, like reference numerals refer to like parts throughout the various figures and embodiments.

In the following embodiments, it will be understood that when an element is referred to as being located "on", "over", "above", "under", "beneath" or "below" another element, it may directly contact the other element, or at least one intervening element may be present therebetween. Accordingly, the terms such as "on", "over", "above", "under", "beneath", "below" and the like that are used herein are for the purpose of describing particular embodiments only and are not intended to limit the scope of the present disclosure.

In the drawings, a thicknesses and length of components are exaggerated compared to actual physical thickness and intervals for convenience of illustration. In the following description, a detailed explanation of known related functions and constitutions may be omitted to avoid unnecessarily obscuring the subject manner. Furthermore, 'connected/coupled' represents that one component is directly coupled to another component or indirectly coupled through another component. In this specification, a singular form may include a plural form as long as it is not specifically mentioned in a sentence. Furthermore, "include/comprise" or "including/comprising" used in the specification represents that one or more components, steps, operations, and elements exist or are added.

Figure 2:
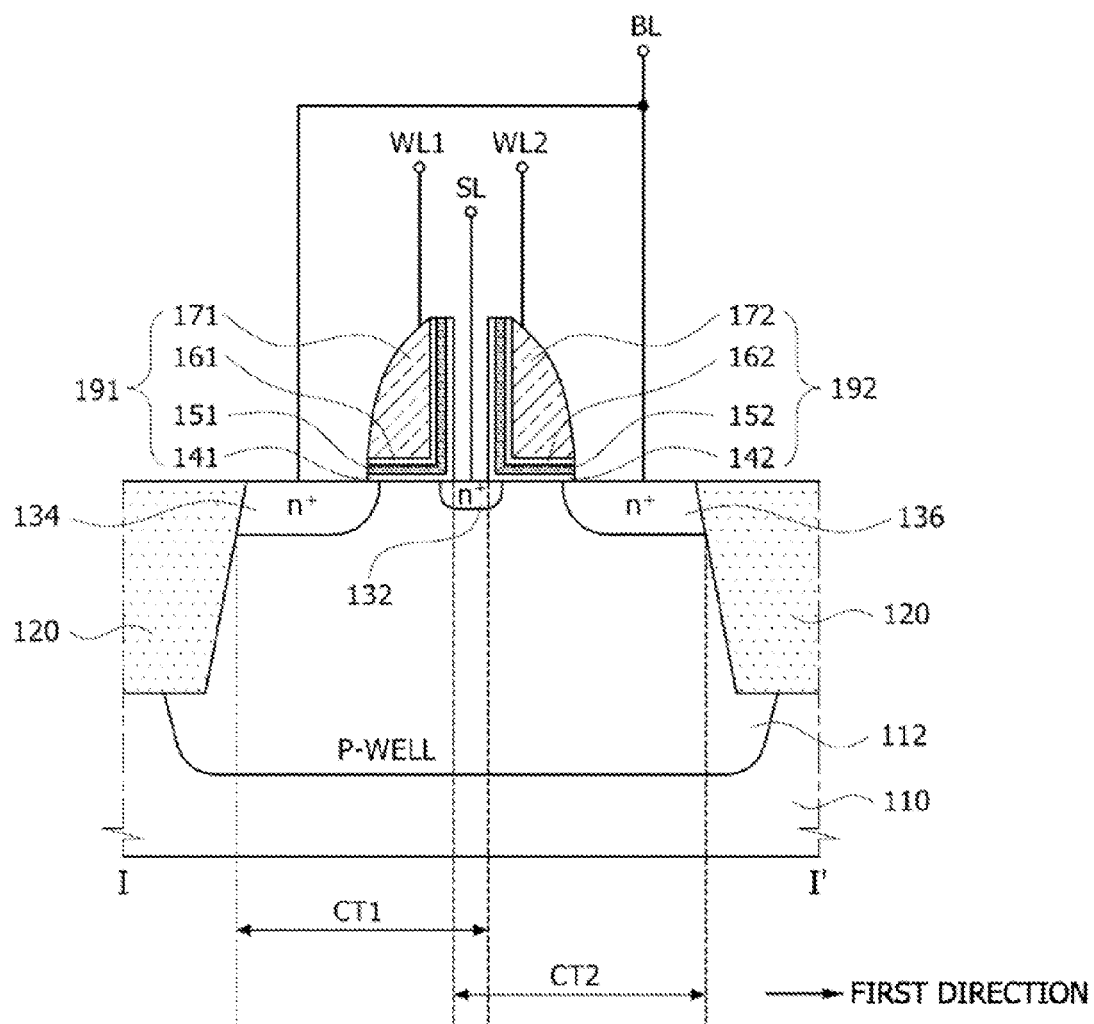
FIG. 2 is a cross-sectional view taken along a line I-I' of FIG. 1.

FIG. 1 is a layout diagram illustrating a unit cell 100 of a nonvolatile memory device according to an embodiment, and FIG. 2 is a cross-sectional view taken along a line I-I' of FIG. 1. Referring to FIGS. 1 and 2, the unit cell 100 may include a first charge storage transistor CT1 and a second charge storage transistor CT2. The first charge storage transistor CT1 may share a single active region 130 with the second charge storage transistor CT2. In particular, the first charge storage transistor CT1 may share a first junction region 132 in the active region 130 with the second charge storage transistor CT2.

The unit cell 100 may include a substrate 110 and a P-type well region 112 disposed in a substrate 110 such that a top surface of the P-type well region 112 is exposed. The substrate 110 may be an N-type substrate. Alternatively, the substrate 110 may be a P-type substrate. If the substrate 110 is a P-type substrate, the P-type well region 112 may be absent in the substrate 110. The active region 130 may be disposed in an upper portion of the P-type well region 112. The active region 130 may be defined by a trench isolation layer 120. Furthermore, the active region 130 may be disposed to extend in a first direction. The active region 130 may include a first N-type junction region 132, a second N-type junction region 134 and a third N-type junction region 136 which are spaced apart from each other. The first N-type junction region 132 may be disposed between the second N-type junction region 134 and the third N-type junction region 136. Although not shown in the drawings, each of the first, second and third N-type junction regions 132, 134 and 136 may have a lightly doped drain (LDD) structure including an extension region lightly doped with N-type impurities and a deep region heavily doped with N-type impurities. The length of the first N-type junction region 132 in the first direction may be less than lengths of the second and third N-type junction regions 134 and 136 in the first direction.

A first charge trap pattern 191 may be disposed on the P-type well region 112 between the first and second N-type junction regions 132 and 134. The first charge trap pattern 191, the first N-type junction region 132 and the second N-type junction region 134 may constitute the first charge storage transistor CT1. The first charge trap pattern 191 may include a first tunneling layer 141, a first charge trap layer 151, a first insulation layer 161 and a first control gate layer 171 which are sequentially stacked. The first charge trap pattern 191 may cross the active region 130 to have a stripe shape extending in a second direction. The first control gate layer 171 may be disposed to have a spacer shape. The first tunneling layer 141, the first charge trap layer 151 and the first insulation layer 161 may cover a bottom surface of the first control gate layer 171 and may extend onto a sidewall of the first control gate layer 171 adjacent to the first N-type junction region 132. The first tunneling layer 141 may include an insulation material, for example, an oxide material. The first charge trap layer 151 may include a charge trap material, for example, a nitride material. The first insulation layer 161 may include an oxide material. The first control gate layer 171 may include a conductive material, for example, a doped polysilicon material.

A second charge trap pattern 192 may be disposed on the P-type well region 112 between the first and third N-type junction regions 132 and 136. The second charge trap pattern 192, the first N-type junction region 132 and the third N-type junction region 136 may constitute the second charge storage transistor CT2. The second charge trap pattern 192 may include a second tunneling layer 142, a second charge trap layer 152, a second insulation layer 162 and a second control gate layer 172 which are sequentially stacked. The second charge trap pattern 192 may cross the active region 130 to have a stripe shape extending in the second direction. The second control gate layer 172 may be disposed to have a spacer shape. The second tunneling layer 142, the second charge trap layer 152 and the second insulation layer 162 may cover a bottom surface of the second control gate layer 172 and may extend onto a sidewall of the second control gate layer 172 adjacent to the first N-type junction region 132. The second tunneling layer 142 may include an insulation material, for example, an oxide material. The second charge trap layer 152 may include a charge trap material, for example, a nitride material. The second insulation layer 162 may include an oxide material. The second control gate layer 172 may include a conductive material, for example, a doped polysilicon material.

The first and second control gate layers 171 and 172 may be electrically connected to a first word line WL1 and a second word line WL2 through a first contact 181 and a second contact 182, respectively. The first N-type junction region 132 may be electrically connected to a source line SL through a third contact 183. The second N-type junction region 134 may be electrically connected to a bit line through a fourth contact 184, and the third N-type junction region 136 may be electrically connected to the bit line through a fifth contact 185.

Figure 3:
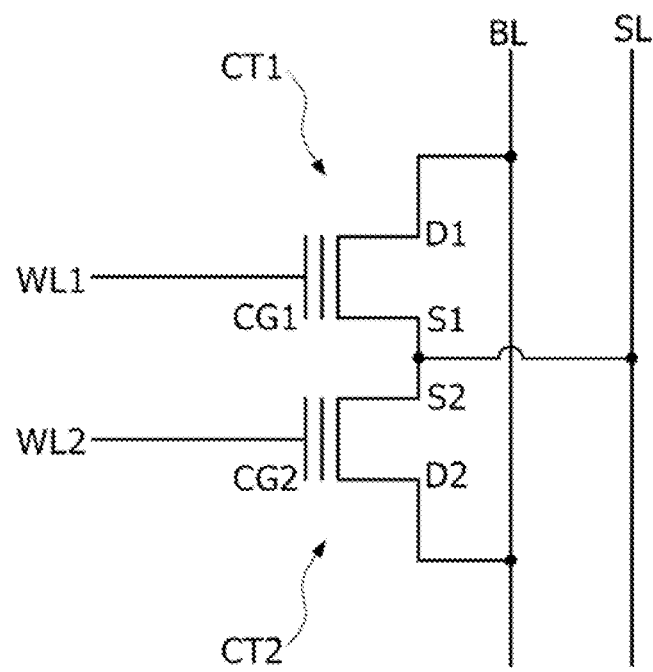
FIG. 3 is an equivalent circuit diagram of the unit cell shown in FIG. 1.

FIG. 3 is an equivalent circuit diagram of the unit cell 100 shown in FIG. 1. Referring to FIGS. 1, 2 and 3, the unit cell 100 may include the first charge storage transistor CT1 and the second charge storage transistor CT2 which are connected in series. The first charge storage transistor CT1 may include a first control gate terminal CG1, a first source terminal S1, and a first drain terminal D1. The first control gate terminal CG1 may be electrically connected to the first word line WL1. The first source terminal S1 may be electrically connected to the source line SL. The first drain terminal D1 may be electrically connected to the bit line BL. The second charge storage transistor CT2 may include a second control gate terminal CG2, a second source terminal S2, and a second drain terminal D2. The second control gate terminal CG2 may be electrically connected to the second word line WL2. The second source terminal S2 may be electrically connected to the source line SL. The second drain terminal D2 may be electrically connected to the bit line BL.

The first control gate terminal CG1, the first source terminal S1 and the first drain terminal D1 of the first charge storage transistor CT1 may correspond to the first control gate layer 171, the first N-type junction region 132 and the second N-type junction region 134 shown in FIGS. 1 and 2, respectively. The second control gate terminal CG2, the second source terminal S2 and the second drain terminal D2 of the second charge storage transistor CT2 may correspond to the second control gate layer 172, the first N-type junction region 132 and the third N-type junction region 136 shown in FIGS. 1 and 2, respectively.

FIGS. 4, 5, 6 and 7 are cross-sectional views illustrating program operations of a nonvolatile memory device according to an embodiment. In FIGS. 4, 5, 6 and 7, the same reference designators as used in FIGS. 1 and 2 may denote the same elements.

Figure 4:
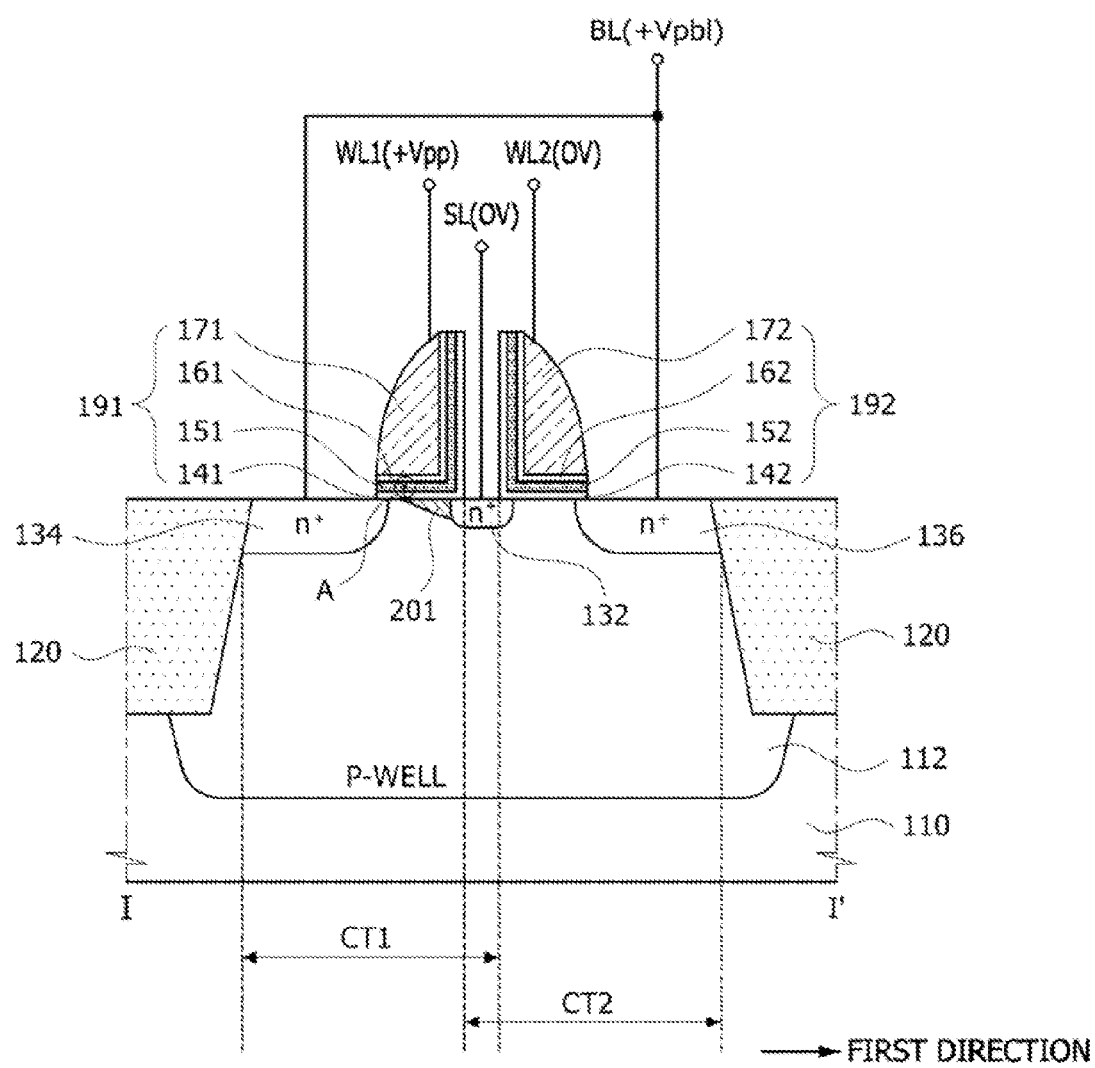
FIG. 4 is a cross-sectional view illustrating program operations of a nonvolatile memory device according to an embodiment.

Referring to FIG. 4, to execute a program operation for injecting charges into a first region "A" of the first charge trap layer 151 of the first charge storage transistor CT1, a positive program voltage +Vpp may be applied to the first word line WL1 and a positive bit line voltage +Vpbl may be applied to the bit line BL. The source line SL, the second word line WL2 and the P-type well region 112 may be grounded. Under the above bias condition, a first inversion layer 201 may be formed in a channel region of the first charge storage transistor CT1, that is, in the P-type well region 112 between the first and second N-type junction regions 132 and 134. Accordingly, electrons may drift from the first N-type junction region 132 toward the second N-type junction region 134 through the first inversion layer 201, and some of the drifted electrons may become hot electrons due to a vertical field created by the positive program voltage +Vpp and a horizontal field created by the positive bit line voltage +Vpbl. The hot electrons may be injected and trapped in the first region "A" of the first charge trap layer 151 adjacent to the second N-type junction region 134 through the first tunneling layer 141. The electrons trapped in the first region "A" may be localized in the first region "A" of the first charge trap layer 151 since the first charge trap layer 151 is a non-conductive layer. As a result, the unit cell 100 may have a first programmed state in which the threshold voltage of the first charge storage transistor CT1 partially increases due to the electrons trapped in the first region "A" adjacent to the second N-type junction region 134.

Figure 5:
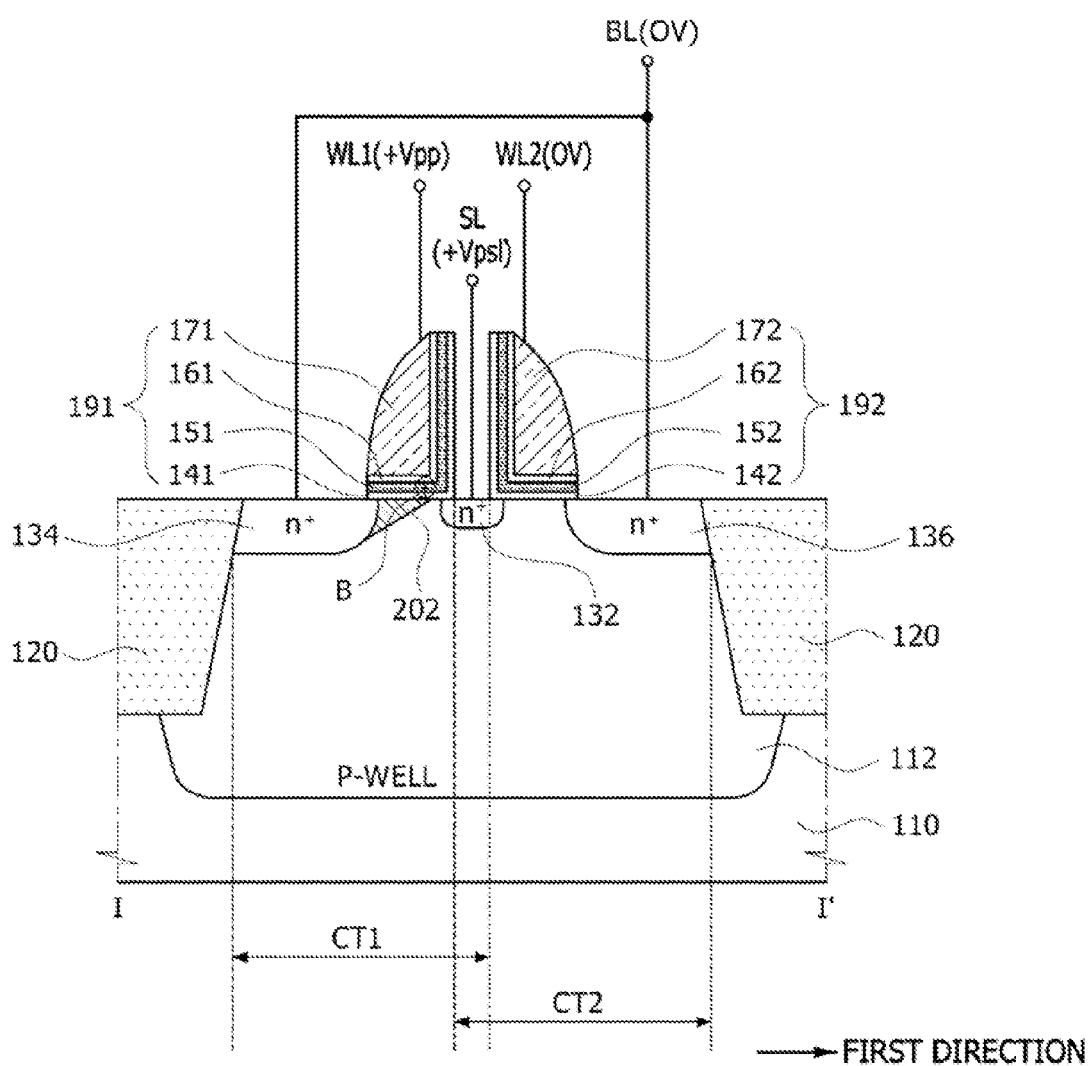
FIG. 5 is a cross-sectional view illustrating program operations of a nonvolatile memory device according to an embodiment.

Referring to FIG. 5, to execute a program operation for injecting charges into a second region "B" of the first charge trap layer 151 of the first charge storage transistor CT1, a positive program voltage +Vpp may be applied to the first word line WL1 and a positive source line voltage +Vpsl may be applied to the source line SL. The bit line BL, the second word line WL2 and the P-type well region 112 may be grounded. Under the above bias condition, a second inversion layer 202 may be formed in the channel region of the first charge storage transistor CT1, that is, in the P-type well region 112 between the first and second N-type junction regions 132 and 134. Accordingly, electrons may drift from the second N-type junction region 134 toward the first N-type junction region 132 through the second inversion layer 202, and some of the drifting electrons may become hot electrons due to a vertical field created by the positive program voltage +Vpp and a horizontal field created by the positive source line voltage +Vpsl. The hot electrons may be injected and trapped in the second region "B" of the first charge trap layer 151 adjacent to the first N-type junction region 132 through the first tunneling layer 141. The electrons trapped in the second region "B" may be localized in the second region "B" of the first charge trap layer 151 since the first charge trap layer 151 is a non-conductive layer. As a result, the unit cell 100 may have a second programmed state in which threshold voltage of the first charge storage transistor CT1 partially increases due to the electrons trapped in the second region "B" adjacent to the first N-type junction region 132.

Figure 6:
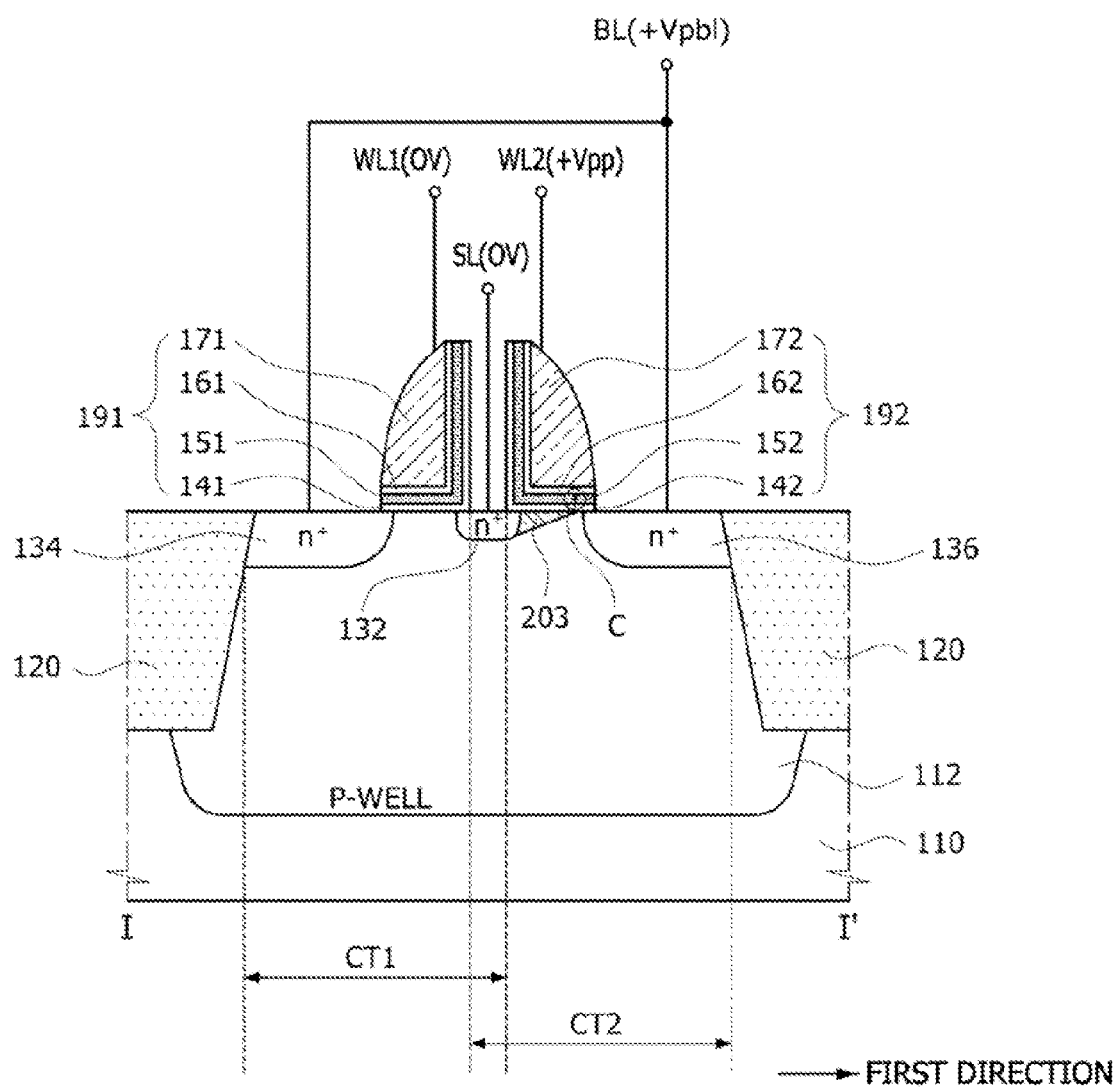
FIG. 6 is a cross-sectional view illustrating program operations of a nonvolatile memory device according to an embodiment.

Referring to FIG. 6, to execute a program operation for injecting charges into a third region "C" of the second charge trap layer 152 of the second charge storage transistor CT2, a positive program voltage +Vpp may be applied to the second word line WL2 and a positive bit line voltage +Vpbl may be applied to the bit line BL. The source line SL, the first word line WL1 and the P-type well region 112 may be grounded. Under the above bias condition, a third inversion layer 203 may be formed in a channel region of the second charge storage transistor CT2, that is, in the P-type well region 112 between the first and third N-type junction regions 132 and 136. Accordingly, electrons may drift from the first N-type junction region 132 toward the third N-type junction region 136 through the third inversion layer 203, and some of the drifted electrons may become hot electrons due to a vertical field created by the positive program voltage +Vpp and a horizontal field created by the positive bit line voltage +Vpbl. The hot electrons may be injected and trapped in the third region "C" of the second charge trap layer 152 adjacent to the third N-type junction region 136 through the second tunneling layer 142. The electrons trapped in the third region "C" may be localized in the third region "C" of the second charge trap layer 152 since the second charge trap layer 152 is a non-conductive layer. As a result, the unit cell 100 may have a third programmed state in which the threshold voltage of the second charge storage transistor CT2 partially increases due to the electrons trapped in the third region "C" adjacent to the third N-type junction region 136.

Figure 7:
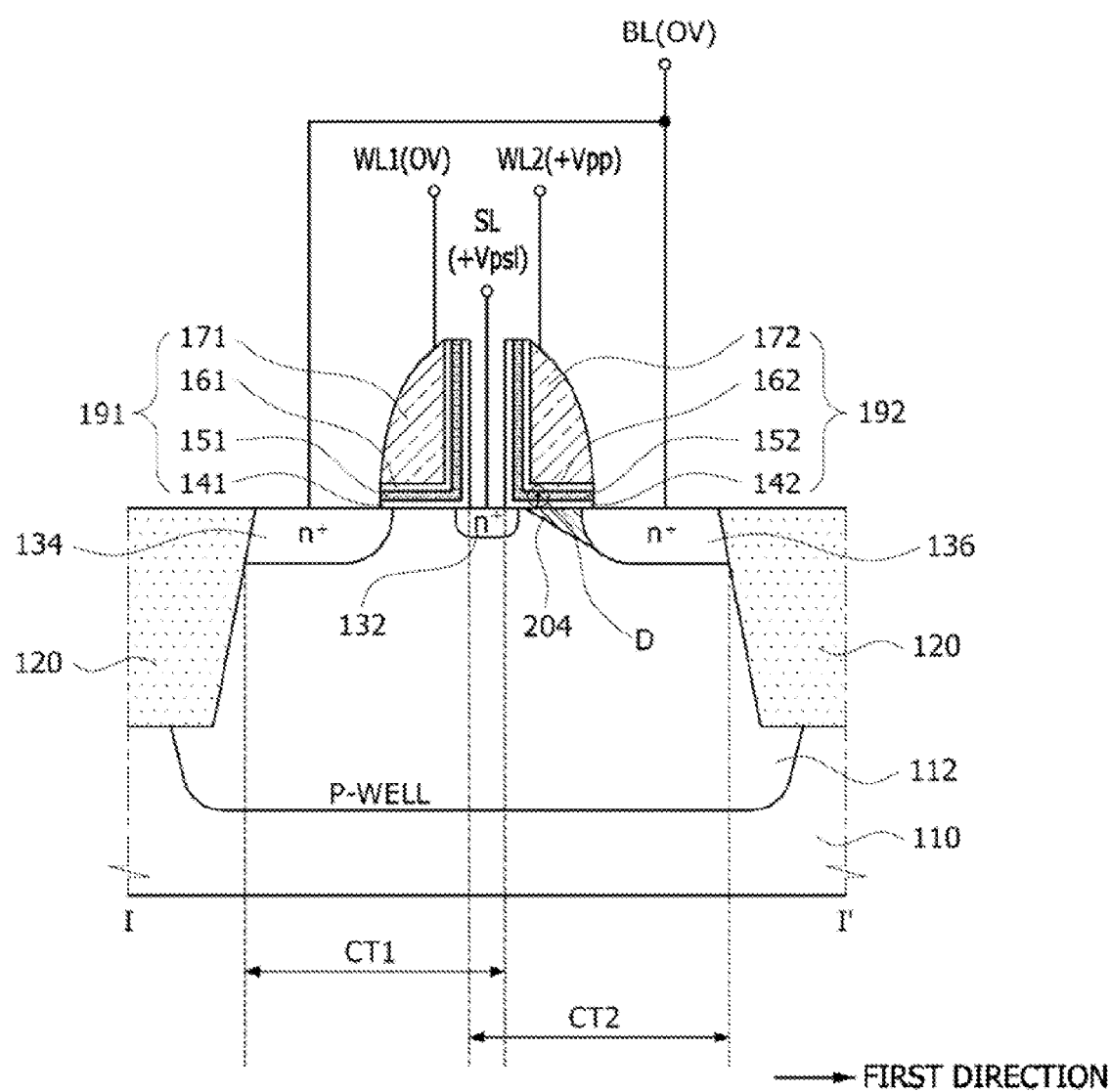
FIG. 7 is a cross-sectional view illustrating program operations of a nonvolatile memory device according to an embodiment.

Referring to FIG. 7, to execute a program operation for injecting charges into a fourth region "D" of the second charge trap layer 152 of the second charge storage transistor CT2, a positive program voltage +Vpp may be applied to the second word line WL2 and a positive source line voltage +Vpsl may be applied to the source line SL. The bit line BL, the first word line WL1 and the P-type well region 112 may be grounded. Under the above bias condition, a fourth inversion layer 204 may be formed in the channel region of the second charge storage transistor CT2, that is, in the P-type well region 112 between the first and third N-type junction regions 132 and 136. Accordingly, electrons may drift from the third N-type junction region 136 toward the first N-type junction region 132 through the fourth inversion layer 204, and some of the drifting electrons may become hot electrons due to a vertical field created by the positive program voltage +Vpp and a horizontal field created by the positive source line voltage +Vpsl. The hot electrons may be injected and trapped in the fourth region "D" of the second charge trap layer 152 adjacent to the first N-type junction region 132 through the second tunneling layer 142. The electrons trapped in the fourth region "D" may be localized in the fourth region "D" of the second charge trap layer 152 since the second charge trap layer 152 is a non-conductive layer. As a result, the unit cell 100 may have a fourth programmed state in which the threshold voltage of the second charge storage transistor CT2 partially increases due to the electrons trapped in the fourth region "D" adjacent to the first N-type junction region 132.

Figure 8:
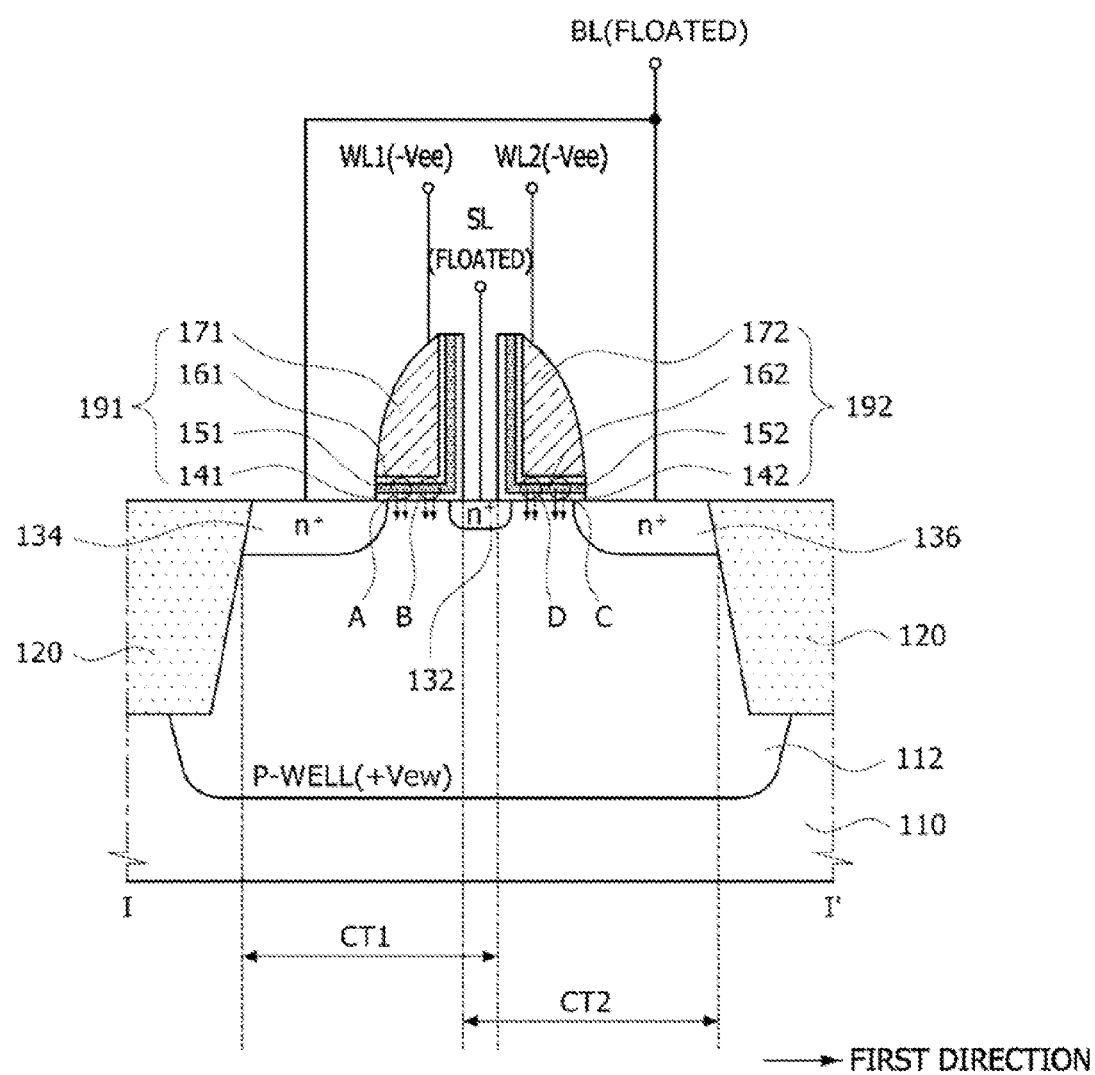
FIG. 8 is a cross-sectional view illustrating erasure operations of a nonvolatile memory device according to an embodiment.
Figure 9:
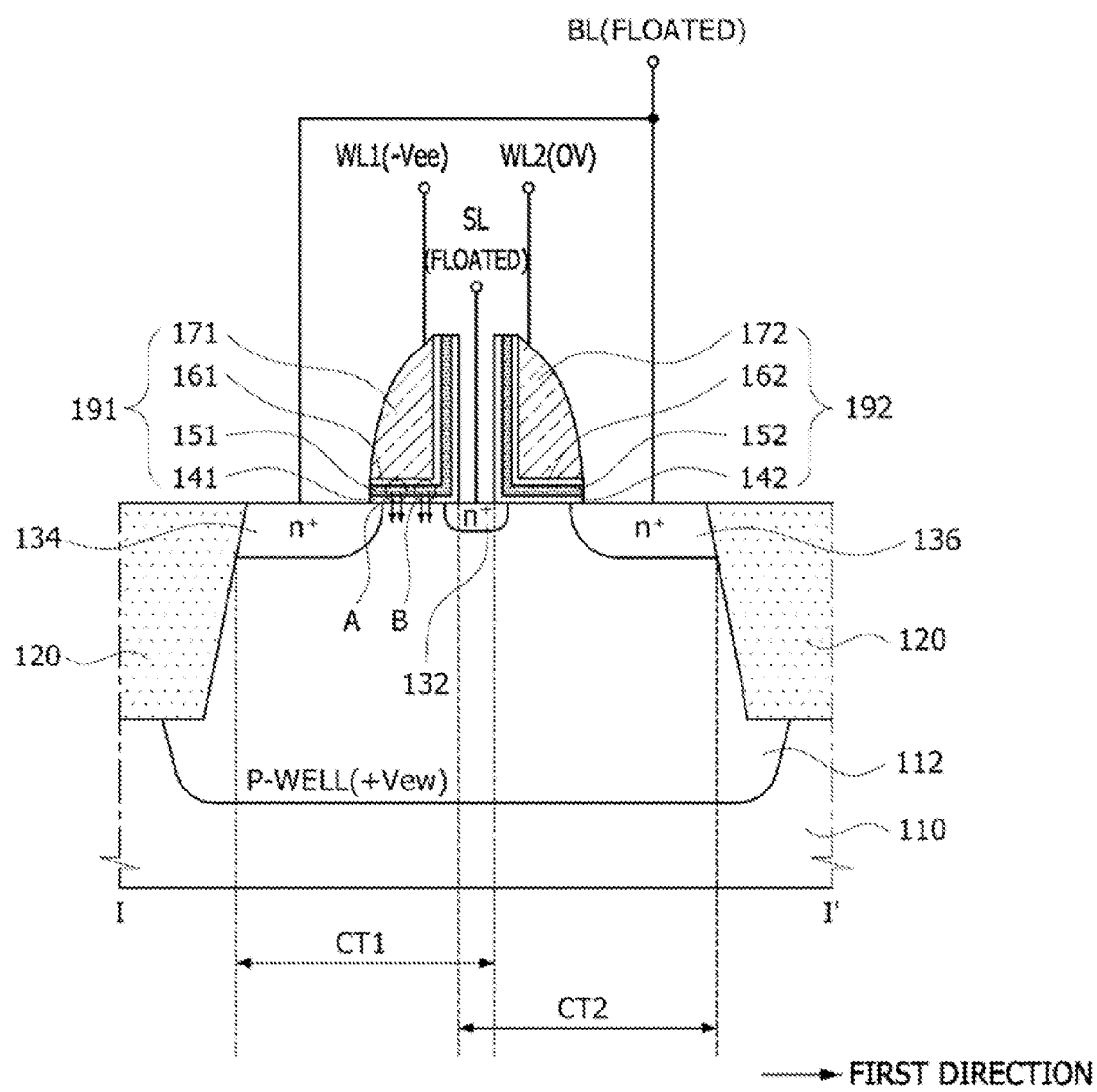
FIG. 9 is a cross-sectional view illustrating erasure operations of a nonvolatile memory device according to an embodiment.

FIGS. 8 and 9 are cross-sectional views illustrating erasure operations of a nonvolatile memory device according to an embodiment. In FIGS. 8 and 9, the same reference designators as used in FIGS. 1 and 2 may denote the same elements.

Referring to FIG. 8, to simultaneously erase data stored in the first and second charge storage transistors CT1 and CT2, a negative erasure voltage −Vee may be applied to the first and second word lines WL1 and WL2 and a positive well voltage +Vew may be applied to the P-type well region 112. The source line SL and the bit line BL may be floated. Under the above bias condition, the electrons trapped in the first and/or second regions "A" and/or "B" of the first charge trap layer 151 and in the third and/or fourth regions "C" and/or "D" of the second charge trap layer 152 may be injected into the P-type well region 112 by a Fowler-Nordheim (F-N) tunneling mechanism, as indicated by arrows. Thus, threshold voltages of the first and second charge storage transistors CT1 and CT2 may be lowered to provide erased states in the first and second charge storage transistors CT1 and CT2, which constitute the unit cell 100.

Referring to FIG. 9, to selectively erase data stored only in the first charge storage transistor CT1, a negative erasure voltage −Vee may be applied to the first word line WL1 and a ground voltage may be applied to the second word line WL2. The positive well voltage +Vew may be applied to the P-type well region 112, and the source line SL and the bit line BL may be floated. Under the above bias condition, the electrons trapped in the first and/or second regions "A" and/or "B" of the first charge trap layer 151 may be injected into the P-type well region 112 by a Fowler-Nordheim (F-N) tunneling mechanism, as indicated by arrows. Thus, the threshold voltage of the first charge storage transistor CT1 may be lowered to provide an erased state of the first charge storage transistor CT1. To selectively erase data stored only in the second charge storage transistor CT2, a negative erasure voltage −Vee may be applied to the second word line WL2 and a ground voltage may be applied to the first word line WL1. The positive well voltage +Vew may be applied to the P-type well region 112, and the source line SL and the bit line BL may be floated.

FIGS. 10, 11, 12 and 13 are cross-sectional views illustrating read operations of a nonvolatile memory device according to an embodiment. In FIGS. 10, 11, 12 and 13, the same reference designators as used in FIGS. 1 and 2 may denote the same elements.

Figure 10:
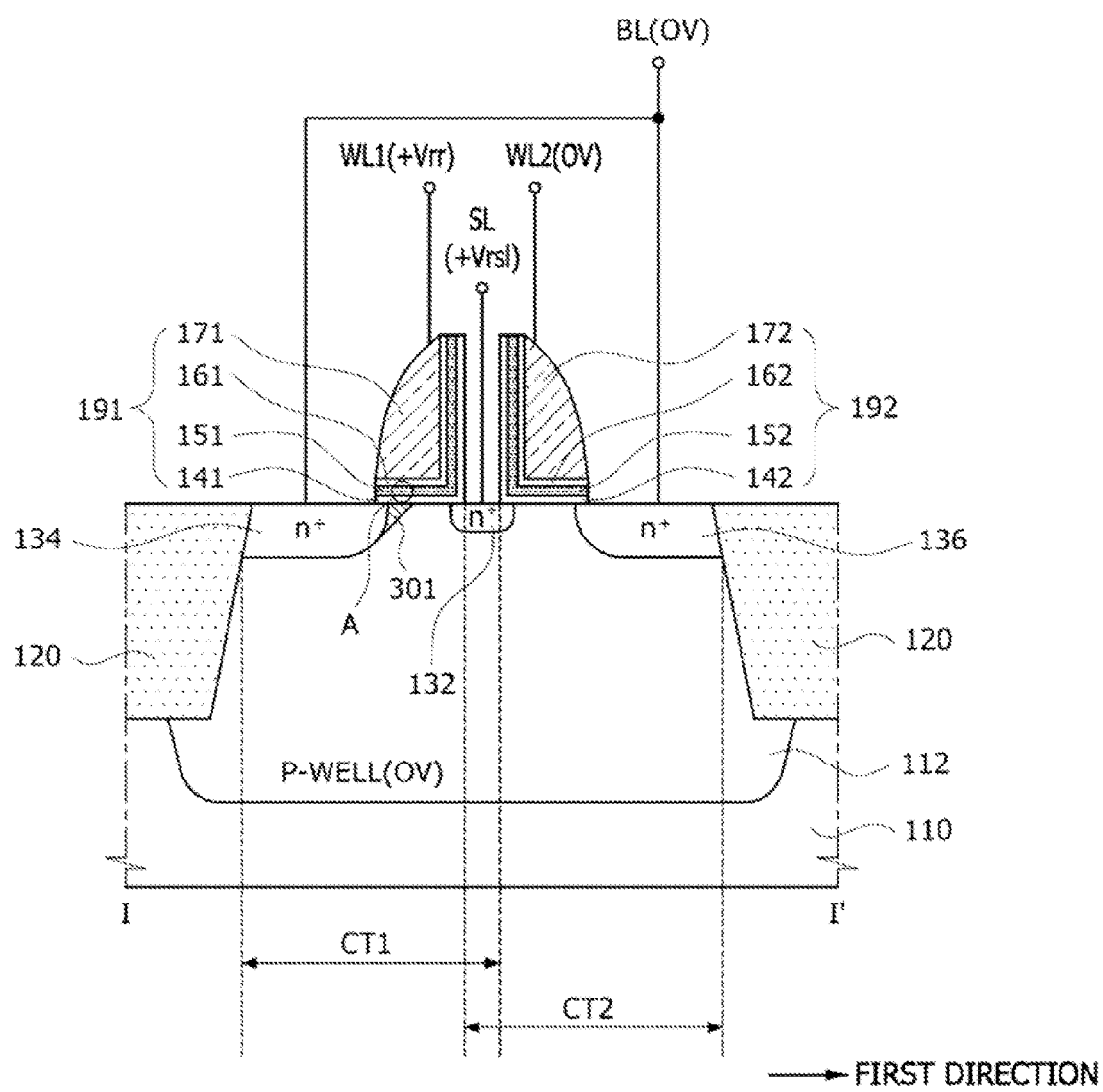
FIG. 10 is a cross-sectional view illustrating read operations of a nonvolatile memory device according to an embodiment.

Referring to FIG. 10, to read out a datum stored in the first region "A" of the first charge trap layer 151 of the first charge storage transistor CT1, a positive read voltage +Vrr may be applied to the first word line WL1 and a positive source line voltage +Vrsl may be applied to the source line SL. The bit line BL, the second word line WL2 and the P-type well region 112 may be grounded. The positive source line voltage +Vrsl may be set to have a voltage value which is capable of causing a pinch-off phenomenon of a channel inversion layer 301, of the first charge storage transistor CT1, to remain under only the first region "A" of the first charge trap layer 151, adjacent to the second N-type junction region 134. That is, the positive source line voltage +Vrsl may be determined such that the first charge storage transistor CT1 operates in a saturation region. Under the above bias condition, the current flow between the first and second N-type junction regions 132 and 134 may be determined according to the partial threshold voltage of an MOS structure including the first region "A" of the first charge trap layer 151. For example, if no current flows between the first and second N-type junction regions 132 and 134, the partial threshold voltage of the MOS structure including the first region "A" may be higher than the positive read voltage +Vrr applied to the first word line WL1. That is, no channel inversion layer is formed under the first region "A" of the first charge trap layer 151. The first region "A" of the first charge trap layer 151 may be regarded as having trap sites filled with charges. That is, the first region "A" of the first charge trap layer 151 may be regarded as being programmed to have the first programmed state described with reference to FIG. 4. In contrast, if current flows between the first and second N-type junction regions 132 and 134, the partial threshold voltage of the MOS structure including the first region "A" may be lower than the positive read voltage +Vrr applied to the first word line WL1. That is, the first charge storage transistor CT1 may operate in a saturation region since the channel inversion layer 301 is formed under the first region "A", as illustrated in FIG. 10. The first region "A" of the first charge trap layer 151 may be regarded as having empty trap sites. That is, the first region "A" of the first charge trap layer 151 may be regarded as having an erased state.

Figure 11:
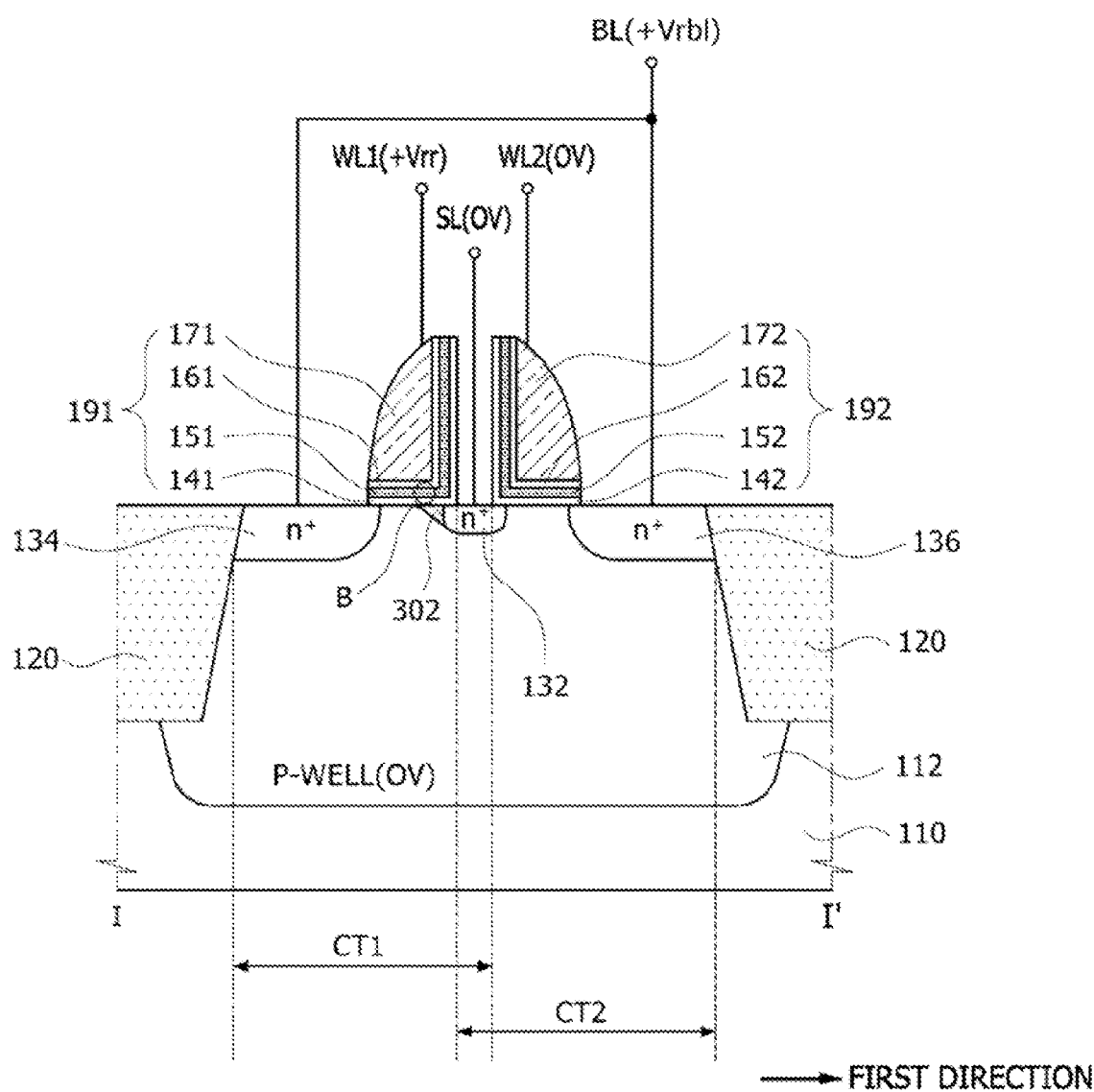
FIG. 11 is a cross-sectional view illustrating read operations of a nonvolatile memory device according to an embodiment.

Referring to FIG. 11, to read out a datum stored in the second region "B" of the first charge trap layer 151 of the first charge storage transistor CT1, a positive read voltage +Vrr may be applied to the first word line WL1 and a positive bit line voltage +Vrbl may be applied to the bit line BL. The source line SL, the second word line WL2 and the P-type well region 112 may be grounded. The positive bit line voltage +Vrbl may be set to have a voltage value which is capable of causing a pinch-off phenomenon of a channel inversion layer 302, of the first charge storage transistor CT1, under only the second region "B" of the first charge trap layer 151, adjacent to the first N-type junction region 132. That is, the positive bit line voltage +Vrbl may be determined such that the first charge storage transistor CT1 operates in a saturation region. Under the above bias condition, current flow between the first and second N-type junction regions 132 and 134 may be determined according to a partial threshold voltage of an MOS structure including the second region "B" of the first charge trap layer 151. For example, if no current flows between the first and second N-type junction regions 132 and 134, the partial threshold voltage of the MOS structure including the second region "B" may be higher than the positive read voltage +Vrr applied to the first word line WL1. That is, no channel inversion layer is formed under the second region "B" of the first charge trap layer 151. The second region "B" of the first charge trap layer 151 may be regarded as having trap sites filled with charges. That is, the second region "B" of the first charge trap layer 151 may be regarded as being programmed to have the second programmed state described with reference to FIG. 5. In contrast, if current flows between the first and second N-type junction regions 132 and 134, the partial threshold voltage of the MOS structure including the second region "B" may be lower than the positive read voltage +Vrr applied to the first word line WL1. That is, the first charge storage transistor CT1 may operate in a saturation region because the channel inversion layer 302 is formed under the second region "B", as illustrated in FIG. 11. The second region "B" of the first charge trap layer 151 may be regarded as having empty trap sites. That is, the second region "B" of the first charge trap layer 151 may be regarded as having an erased state.

Figure 12:
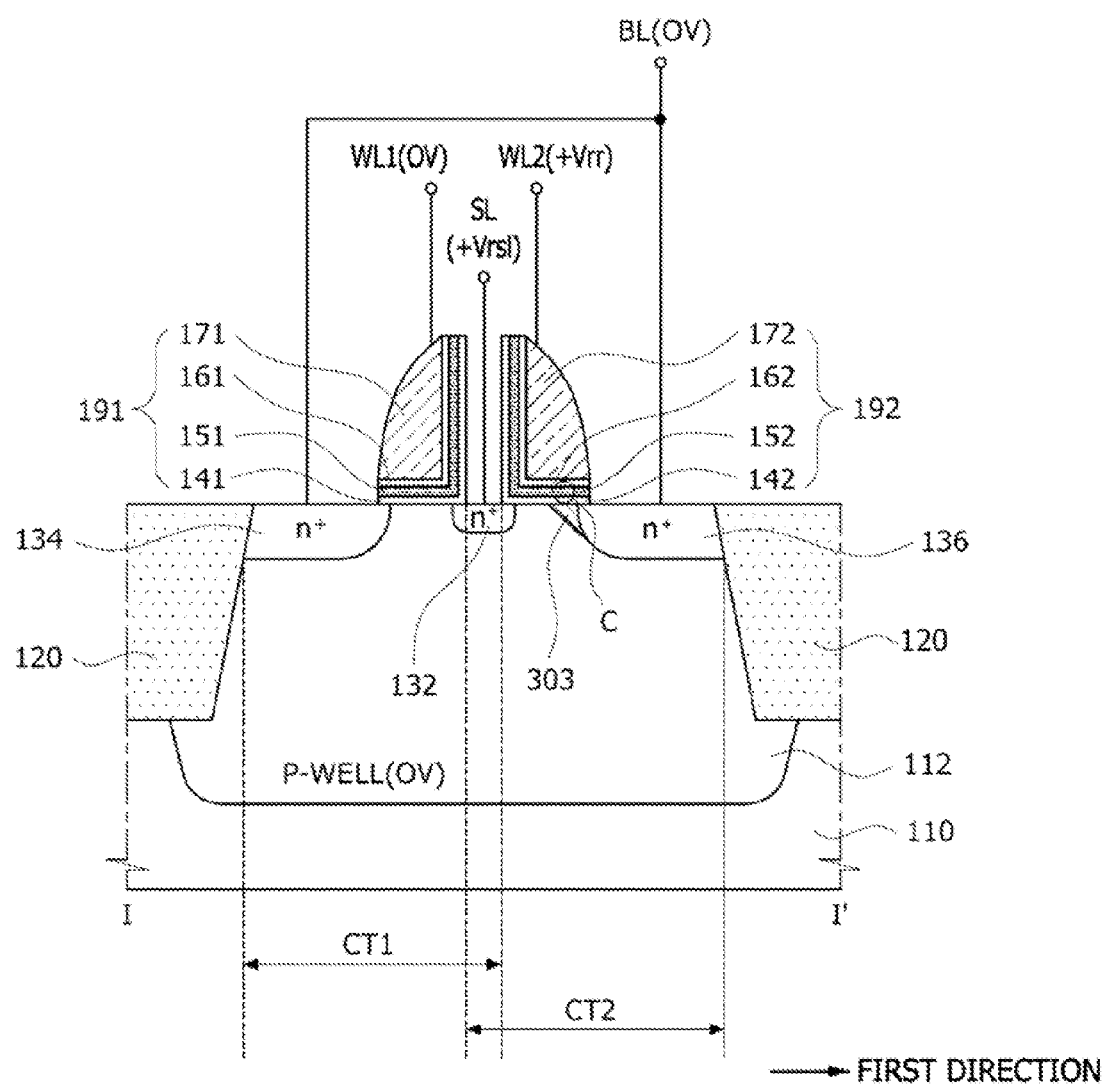
FIG. 12 is a cross-sectional view illustrating read operations of a nonvolatile memory device according to an embodiment.

Referring to FIG. 12, to read out a datum stored in the third region "C" of the second charge trap layer 152 of the second charge storage transistor CT2, a positive read voltage +Vrr may be applied to the second word line WL2 and a positive source line voltage +Vrsl may be applied to the source line SL. The bit line BL, the first word line WL1 and the P-type well region 112 may be grounded. The positive source line voltage +Vrsl may be set to have a voltage value which is capable of causing a pinch-off phenomenon of a channel inversion layer 303, of the second charge storage transistor CT2, to remain under only the third region "C" of the second charge trap layer 152, adjacent to the third N-type junction region 136. That is, the positive source line voltage +Vrsl may be determined such that the second charge storage transistor CT2 operates in a saturation region. Under the above bias condition, current flow between the first and third N-type junction regions 132 and 136 may be determined according to a partial threshold voltage of an MOS structure including the third region "C" of the second charge trap layer 152. For example, if no current flows between the first and third N-type junction regions 132 and 136, the partial threshold voltage of the MOS structure including the first region "C" may be higher than the positive read voltage +Vrr applied to the second word line WL2. That is, no channel inversion layer is formed under the third region "C" of the second charge trap layer 152. The third region "C" of the second charge trap layer 152 may be regarded as having trap sites filled with charges. That is, the third region "C" of the second charge trap layer 152 may be regarded as being programmed to have the third programmed state described with reference to FIG. 6. In contrast, if current flows between the first and third N-type junction regions 132 and 136, the partial threshold voltage of the MOS structure including the third region "C" may be lower than the positive read voltage +Vrr applied to the second word line WL2. That is, the second charge storage transistor CT2 may operate in a saturation region because the channel inversion layer 303 is formed under the third region "C", as illustrated in FIG. 12. The third region "C" of the second charge trap layer 152 may be regarded as having empty trap sites. That is, the third region "C" of the second charge trap layer 152 may be regarded as having an erased state.

Figure 13:
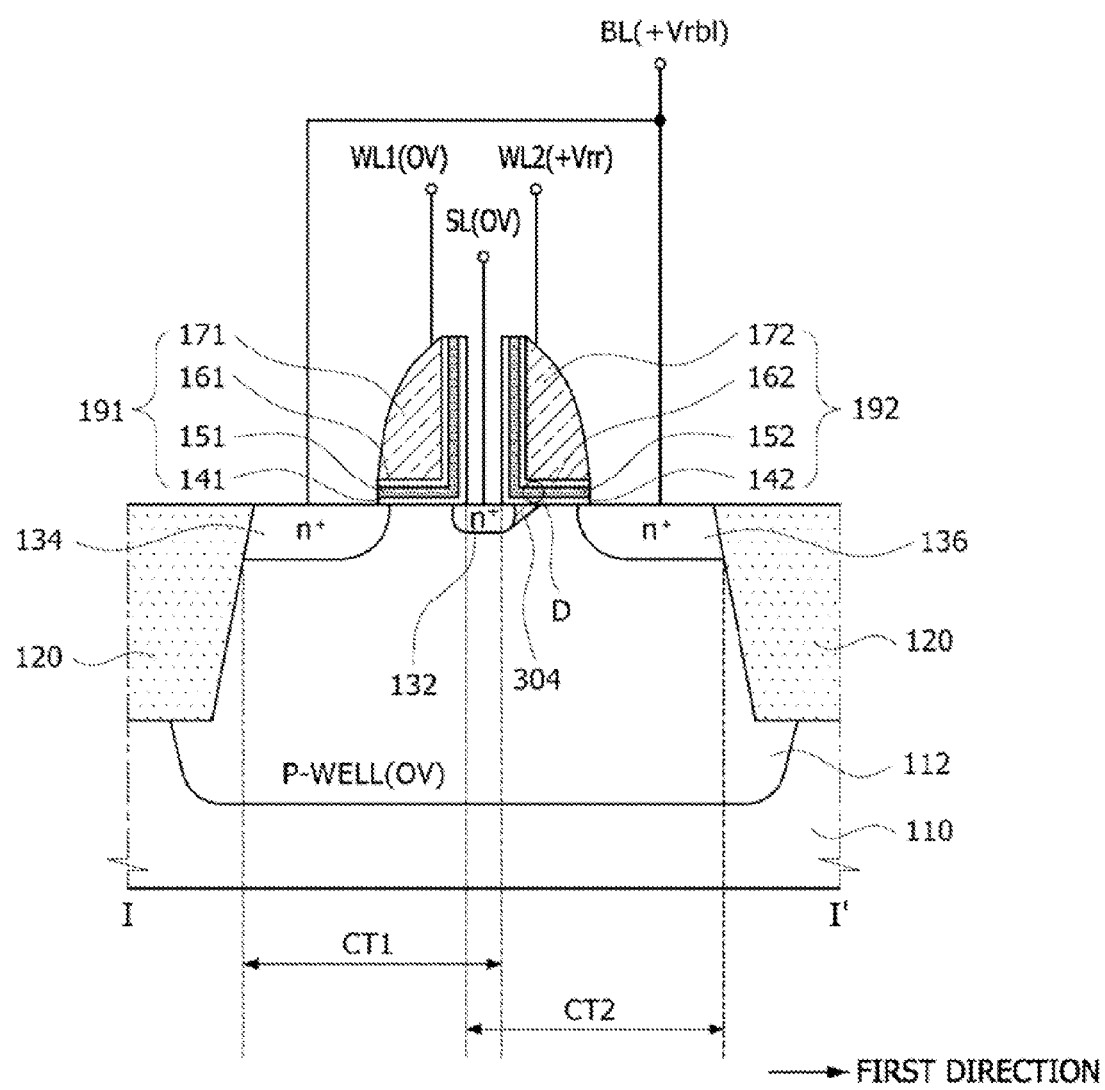
FIG. 13 is a cross-sectional view illustrating read operations of a nonvolatile memory device according to an embodiment.

Referring to FIG. 13, to read out a datum stored in the fourth region "D" of the second charge trap layer 152 of the second charge storage transistor CT2, a positive read voltage +Vrr may be applied to the second word line WL2 and a positive bit line voltage +Vrbl may be applied to the bit line BL. The source line SL, the first word line WL1 and the P-type well region 112 may be grounded. The positive bit line voltage +Vrbl may be set to have a voltage value which is capable of causing a pinch-off phenomenon of a channel inversion layer 304, of the second charge storage transistor CT2, to remain under only the fourth region "D" of the second charge trap layer 152, adjacent to the first N-type junction region 132. That is, the positive bit line voltage +Vrbl may be determined such that the second charge storage transistor CT2 operates in a saturation region. Under the above bias condition, current flow between the first and third N-type junction regions 132 and 136 may be determined according to a partial threshold voltage of an MOS structure including the fourth region "D" of the second charge trap layer 152. For example, if no current flows between the first and third N-type junction regions 132 and 136, the partial threshold voltage of the MOS structure including the fourth region "D" may be higher than the positive read voltage +Vrr applied to the second word line WL2. That is, no channel inversion layer is formed under the fourth region "D" of the second charge trap layer 152. The fourth region "D" of the second charge trap layer 152 may be regarded as having trap sites filled with charges. That is, the fourth region "D" of the second charge trap layer 152 may be regarded as being programmed to have the fourth programmed state described with reference to FIG. 7. In contrast, if current flows between the first and third N-type junction regions 132 and 136, the partial threshold voltage of the MOS structure including the fourth region "D" may be lower than the positive read voltage +Vrr applied to the second word line WL2. That is, the second charge storage transistor CT2 may operate in a saturation region because the channel inversion layer 304 is formed under the fourth region "D", as illustrated in FIG. 13. The fourth region "D" of the second charge trap layer 152 may be regarded as having empty trap sites. That is, the fourth region "D" of the second charge trap layer 152 may be regarded as having an erased state.

Figure 14:
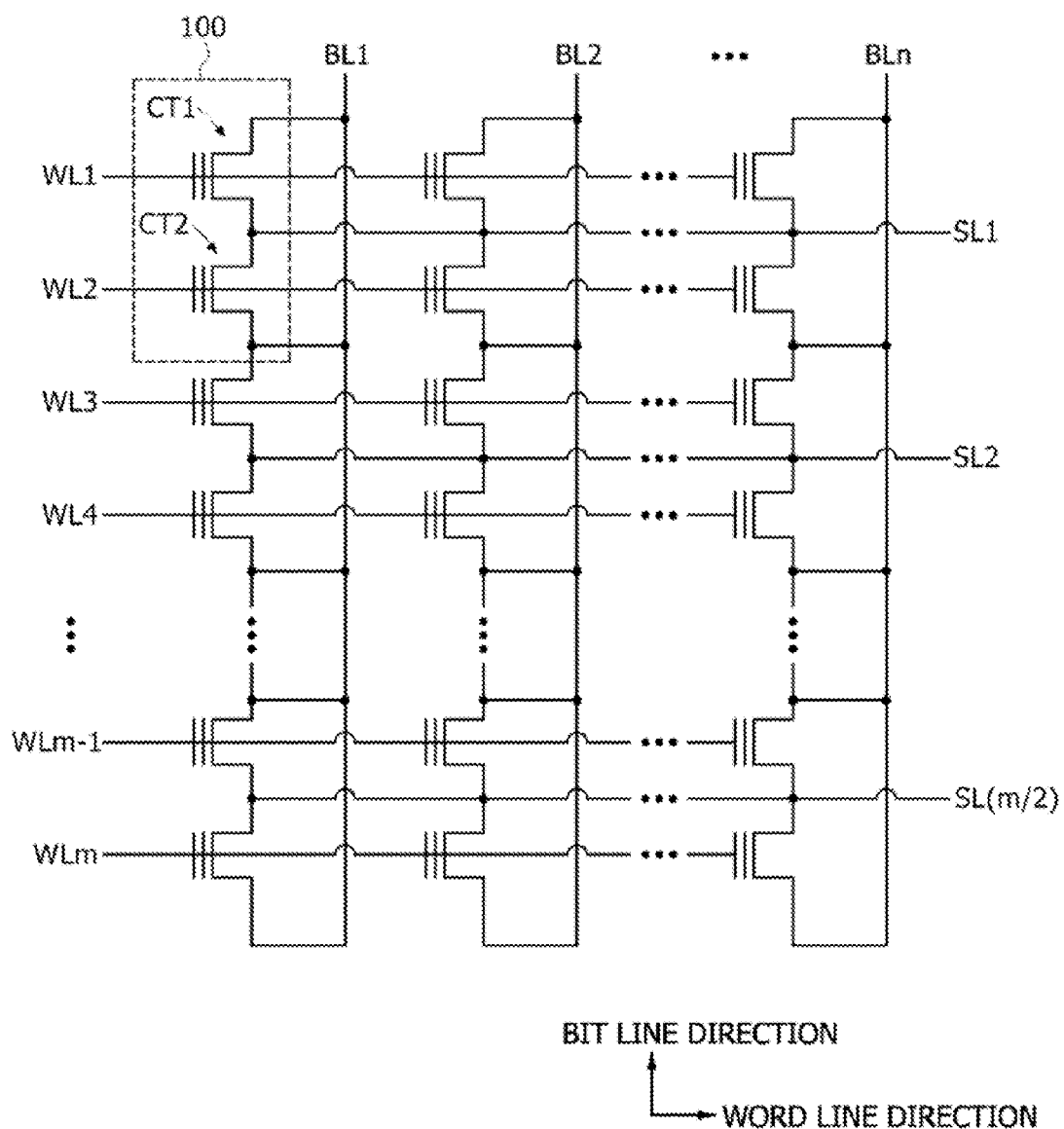
FIG. 14 is an equivalent circuit diagram illustrating a cell array of a nonvolatile memory device according to an embodiment.

FIG. 14 is an equivalent circuit diagram illustrating a cell array of a nonvolatile memory device according to an embodiment. Referring to FIG. 14, a plurality of unit cells 100 may be two dimensionally arrayed along a bit line direction and a word line direction to have an "(m/2)×n" matrix form. Each of the unit cells 100 may include a first charge storage transistor CT1 and a second charge storage transistor CT2, which are connected in series along the bit line direction, as described with reference to FIGS. 1 and 2. Thus, a detailed description of each unit cell 100 will be omitted hereinafter. The unit cells 100 may be connected to bit lines BL1, BL2, . . . , and BLn. That is, each of the bit lines BL1, BL2, . . . , and BLn may be connected to the second and third N-type junction regions (134 and 136 of FIGS. 1 and 2) of the unit cells 100 arrayed in a single column parallel with the bit line direction. Additionally, the unit cells 100 arrayed in the word line direction may be connected to a pair of adjacent word lines WL1 and WL2, WL3 and WL4, . . . or WLm−1 and WLm. That is, the first control gate layers (171 of FIGS. 1 and 2) of the first charge storage transistors CT1 of the unit cells 100 arrayed in a single row parallel with the word line direction may be connected to one of odd-numbered word lines among the word lines WL1 and WL2, WL3 and WL4, . . . or WLm−1 and WLm, and the second control gate layers (172 of FIGS. 1 and 2) of the second charge storage transistors CT2 of the unit cells 100 arrayed in a single row parallel with the word line direction may be connected to one of even-numbered word lines among the word lines WL1 and WL2, WL3 and WL4, . . . or WLm−1 and WLm. Moreover, the unit cells 100 arrayed in the word line direction may be connected to one of a plurality of source lines SL1, SL2, . . . , and SL(m/2). That is, the first N-type junction regions (132 of FIGS. 1 and 2) of the unit cells 100 arrayed in a single row may be connected to one of the plurality of source lines SL1, SL2, . . . , and SL(m/2).

Figure 15:
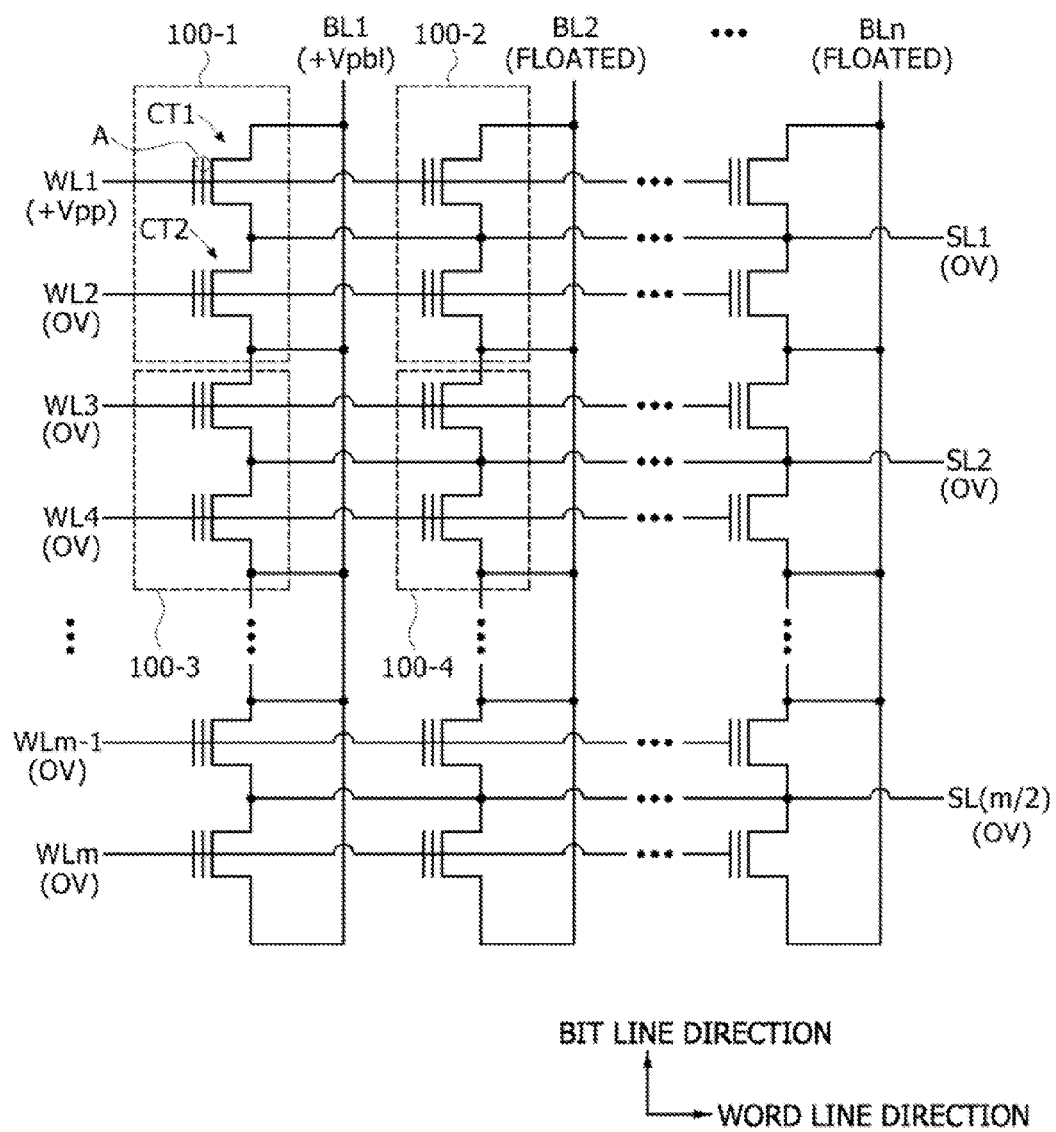
FIG. 15 is an equivalent circuit diagram illustrating a program operation of the cell array shown in FIG. 14.

FIG. 15 is an equivalent circuit diagram illustrating a program operation of the cell array shown in FIG. 14. The program operation will be described hereinafter in conjunction with a first program operation which is executed by injecting charges into the first region "A" of the first charge storage transistor CT1 of a unit cell 100-1 connected to the word lines WL1 and WL2, the bit line BL1 and the source line SL1. It should be apparent to those of ordinary skill in the art that the first program operation is equally applicable to other program operations, for example, a second program operation executed by injecting charges into the second region "B" of the first charge storage transistor CT1 of the unit cell 100-1, a third program operation executed by injecting charges into the third region "C" of the second charge storage transistor CT2 of the unit cell 100-1, and a fourth program operation executed by injecting charges into the fourth region "D" of the second charge storage transistor CT2 of the unit cell 100-1.

Referring to FIG. 15, a positive program voltage +Vpp, a positive bit line voltage +Vpbl and a ground voltage may be applied to the word line WL1, the bit line BL1 and the source line SL1 connected to the first charge storage transistor CT1 of the unit cell 100-1, respectively. The remaining word lines WL2, WL3, WL4, . . . , WLm−1 and WLm may be grounded, and the remaining bit lines BL2, . . . , and BLn may be floated. Moreover, the remaining source lines SL2, . . . , and SL(m/2) may be grounded. Under the above bias condition, electrons may be injected and trapped into the region "A" of the first charge storage transistor CT1 of the unit cell 100-1 to execute the first program operation, as described with reference to FIG. 4.

During the first program operation, the first charge storage transistor CT1 of another unit cell 100-2 sharing the word line WL1 with the unit cell 100-1 is not programmed since the bit line BL2 is floated. Similarly, during the first program operation, the first charge storage transistors CT1 of the other unit cells sharing the word line WL1 with the unit cells 100-1 and 100-2 are not programmed since the bit lines BL3, . . . , and BLn are floated. During the first program operation, another unit cell 100-3 sharing the bit line BL1 with the unit cell 100-1 is not programmed since the word lines WL3 and WL4 are grounded. Similarly, during the first program operation, the other unit cells sharing the bit line BL1 with the unit cells 100-1 and 100-3 are not programmed since the word lines WL5, . . . , and WLm are grounded. During the first program operation, another unit cell 100-4 connected to the bit line BL2 and the word lines WL3 and WL4 is not programmed since the bit line BL2 is floated and the word lines WL3 and WL4 are grounded. Similarly, during the first program operation, the other unit cells connected to the bit lines BL3, . . . , and BLn and the word lines WL5, . . . , and WLm are not programmed since the bit lines BL3, . . . , and BLn are floated and the word lines WL5, . . . , and WLm are grounded.

Figure 16:
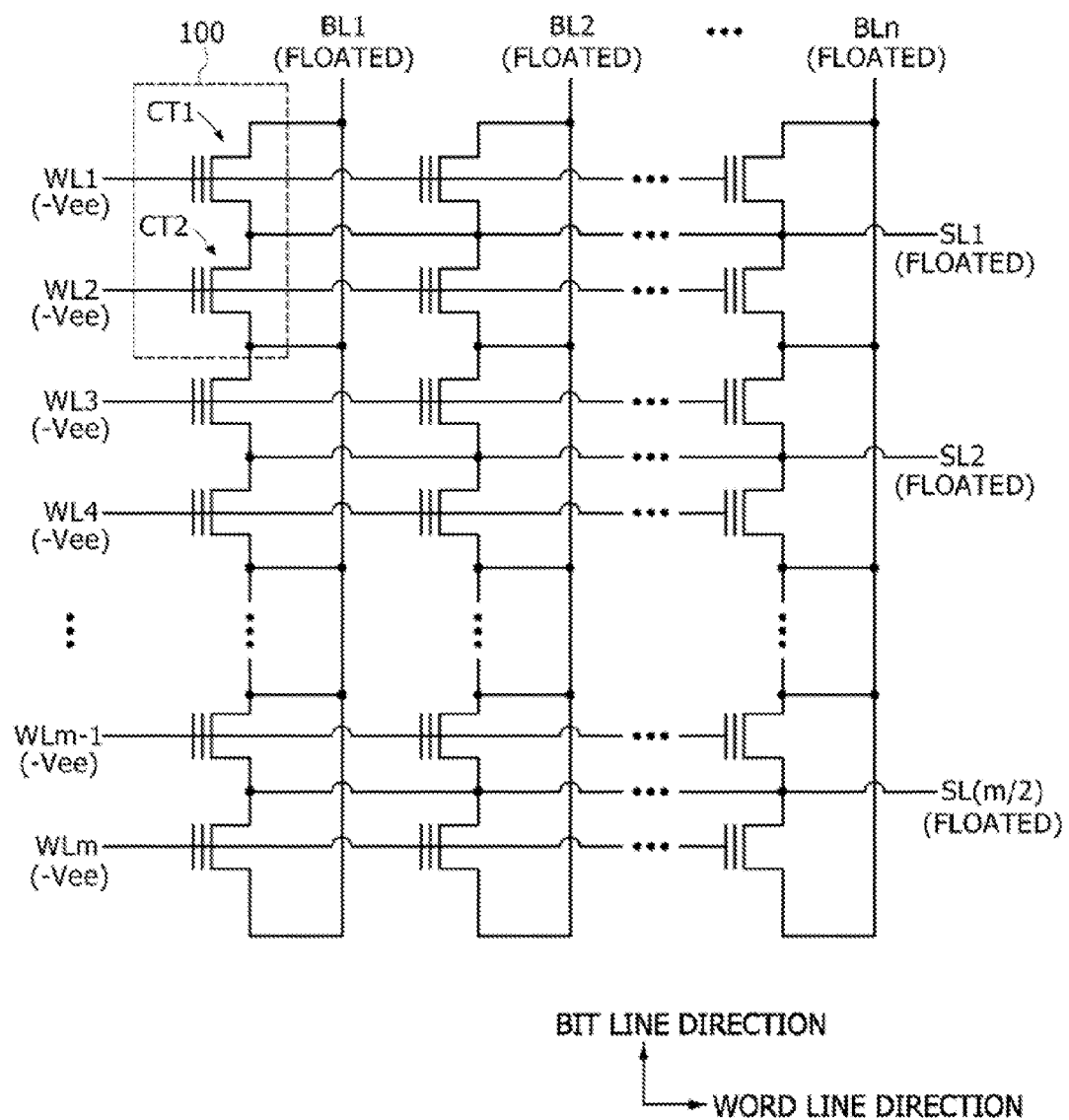
FIG. 16 is an equivalent circuit diagram illustrating an example of an erasure operation of the cell array shown in FIG. 14.

FIG. 16 is an equivalent circuit diagram illustrating an example of an erasure operation of the cell array shown in FIG. 14. Referring to FIG. 16, to erase all of the unit cells 100 at once, a negative erasure voltage −Vee may be applied to all of the word lines WL1, WL2, . . . , and WLm. Additionally, a positive well voltage +Vew may be applied to the P-type well regions (112 of FIG. 8), as described with reference to FIG. 8. Moreover, all of the bit lines BL1, . . . , and BLn and all of the source lines SL1, . . . , and SL(m/2) may be floated. Under the above bias condition, all of the unit cells 100 may be erased by an F-N tunneling mechanism described with reference to FIG. 8.

Figure 17:
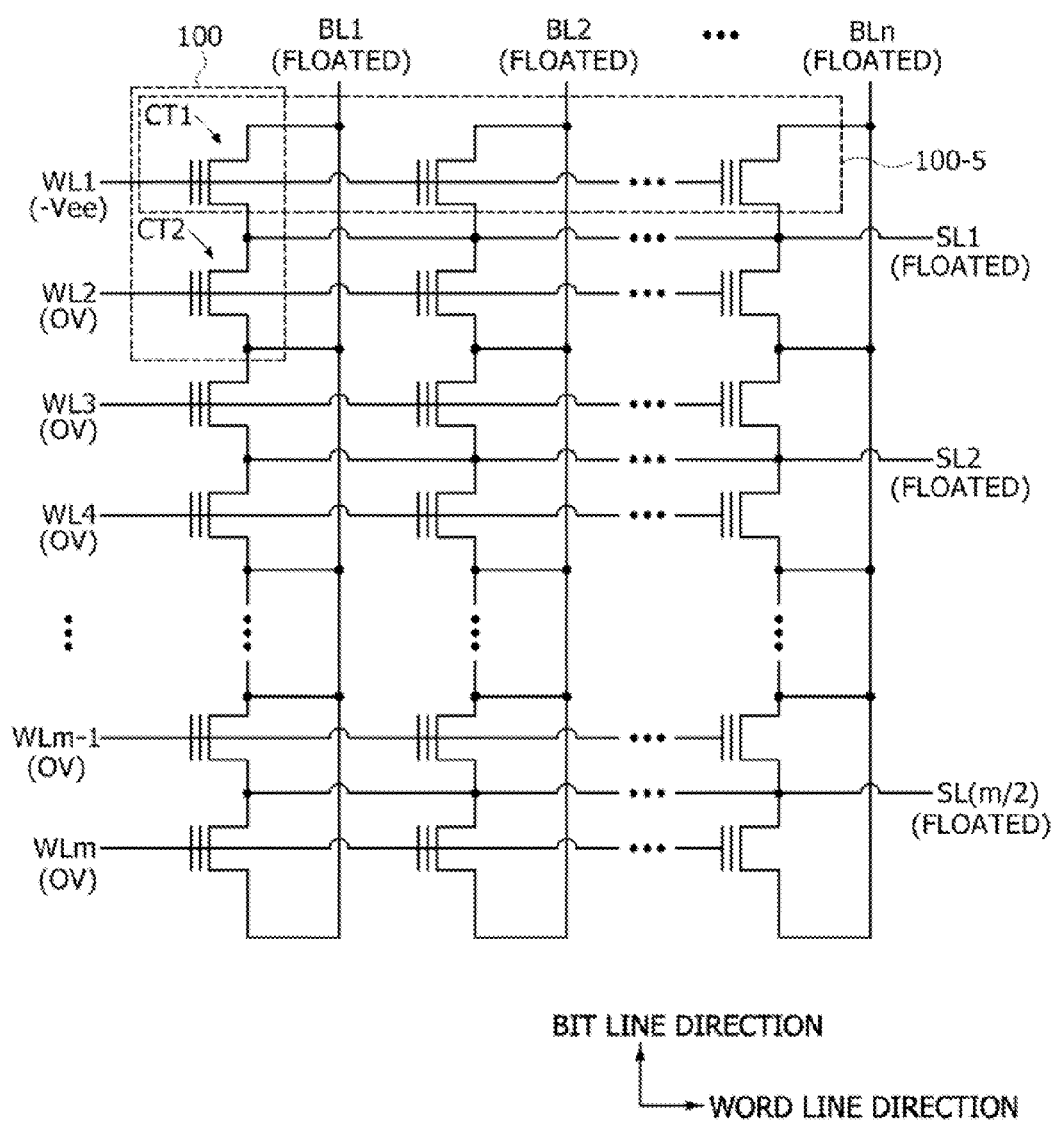
FIG. 17 is an equivalent circuit diagram illustrating another example of an erasure operation of the cell array shown in FIG. 14.

FIG. 17 is an equivalent circuit diagram illustrating another example of an erasure operation of the cell array shown in FIG. 14. Referring to FIG. 17, to selectively erase the first charge storage transistors CT1 sharing the word line WL1 and constituting a single page 100-5, a negative erasure voltage −Vee may be selectively applied to the word line WL1 and the remaining word lines WL2, . . . , and WLm may be grounded. Additionally, a positive well voltage +Vew may be applied to a P-type well region (112 of FIG. 9), as described with reference to FIG. 9. Moreover, all of the bit lines BL1, . . . , and BLn and all of the source lines SL1, . . . , and SL(m/2) may be floated. Under the above bias condition, all of the first charge storage transistors CT1 sharing the word line WL1 and constituting the single page 100-5 may be selectively erased by an F-N tunneling mechanism described with reference to FIG. 9. The remaining first charge storage transistors CT1 and all of the second charge storage transistors CT2 are not erased since the word lines WL2, . . . , and WLm are grounded.

Figure 18:
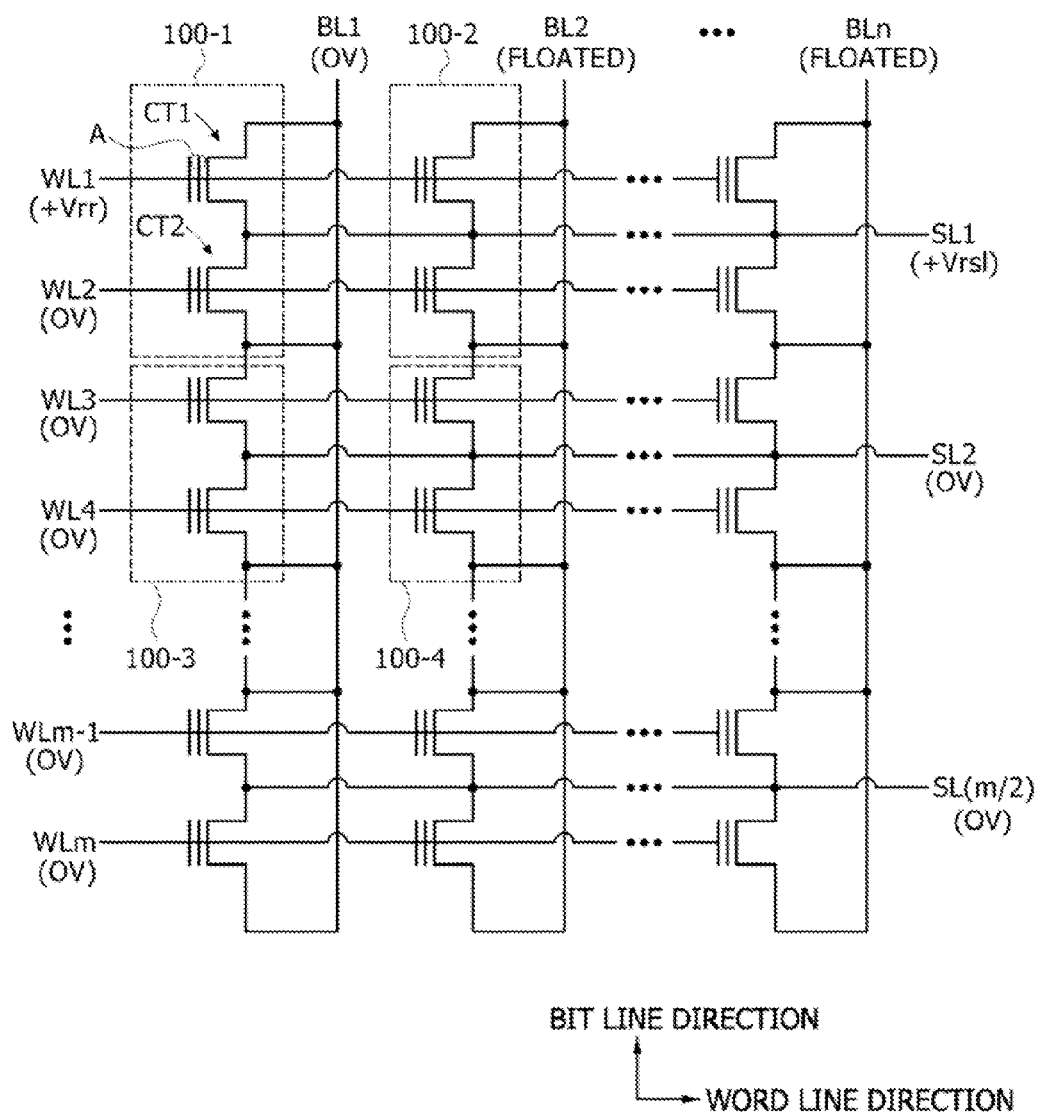
FIG. 18 is an equivalent circuit diagram illustrating a read operation of the cell array shown in FIG. 14.

FIG. 18 is an equivalent circuit diagram illustrating a read operation of the cell array shown in FIG. 14. The read operation will be described hereinafter in conjunction with a first read operation for reading out a datum stored in the first region "A" of the first charge storage transistor CT1 of the unit cell 100-1 connected to the word lines WL1 and WL2, the bit line BL1 and the source line SL1. It should be apparent to those of ordinary skill in the art that the first read operation is equally applicable to other read operations, for example, a second read operation for reading out a datum stored in the second region "B" of the first charge storage transistor CT1 of the unit cell 100-1, a third read operation for reading out a datum stored in the third region "C" of the second charge storage transistor CT2 of the unit cell 100-1, and a fourth read operation for reading out a datum stored in the fourth region "D" of the second charge storage transistor CT2 of the unit cell 100-1.

Referring to FIG. 18, a positive read voltage +Vrr and a positive source line voltage +Vrsl may be applied to the word line WL1 and the source line SL1, connected to the first charge storage transistor CT1 of the unit cell 100-1, respectively. Additionally, the remaining word lines WL2, . . . , and WLm and the bit line BL1 may be grounded. Moreover, the remaining bit lines BL2, . . . , and BLn may be floated and the remaining source lines SL2, . . . , and SL(m/2) may be grounded. Under the above bias condition, the first read operation may be selectively executed to determine whether charges are trapped in the first region "A" of the first charge storage transistor CT1 of the unit cell 100-1, as described with reference to FIG. 10.

During the first read operation, data that may be stored in the first charge storage transistor CT1 of another unit cell 100-2, sharing the word line WL1 with the unit cell 100-1, is not read out since the bit line BL2 is floated. Similarly, during the first program operation, no data stored in the first charge storage transistors CT1 of the other unit cells sharing the word line WL1 with the unit cells 100-1 and 100-2 are not read out since the bit lines BL3, . . . , and BLn are floated. During the first program operation, data stored in another unit cell 100-3 sharing the bit line BL1 with the unit cell 100-1 is not read out since the word lines WL3 and WL4 are grounded. Similarly, during the first program operation, data stored in the other unit cells sharing the bit line BL1 with the unit cells 100-1 and 100-3 are not read out since the word lines WL5, . . . , and WLm are grounded. During the first program operation, data stored in another unit cell 100-4 connected to the bit line BL2 and the word lines WL3 and WL4 are not read out since the bit line BL2 is floated and the word lines WL3 and WL4 are grounded. Similarly, during the first program operation, data stored in the other unit cells connected to the bit lines BL3, . . . , and BLn and the word lines WL5, . . . , and WLm is not read out since the bit lines BL3, . . . , and BLn are floated and the word lines WL5, . . . , and WLm are grounded.

Figure 19:
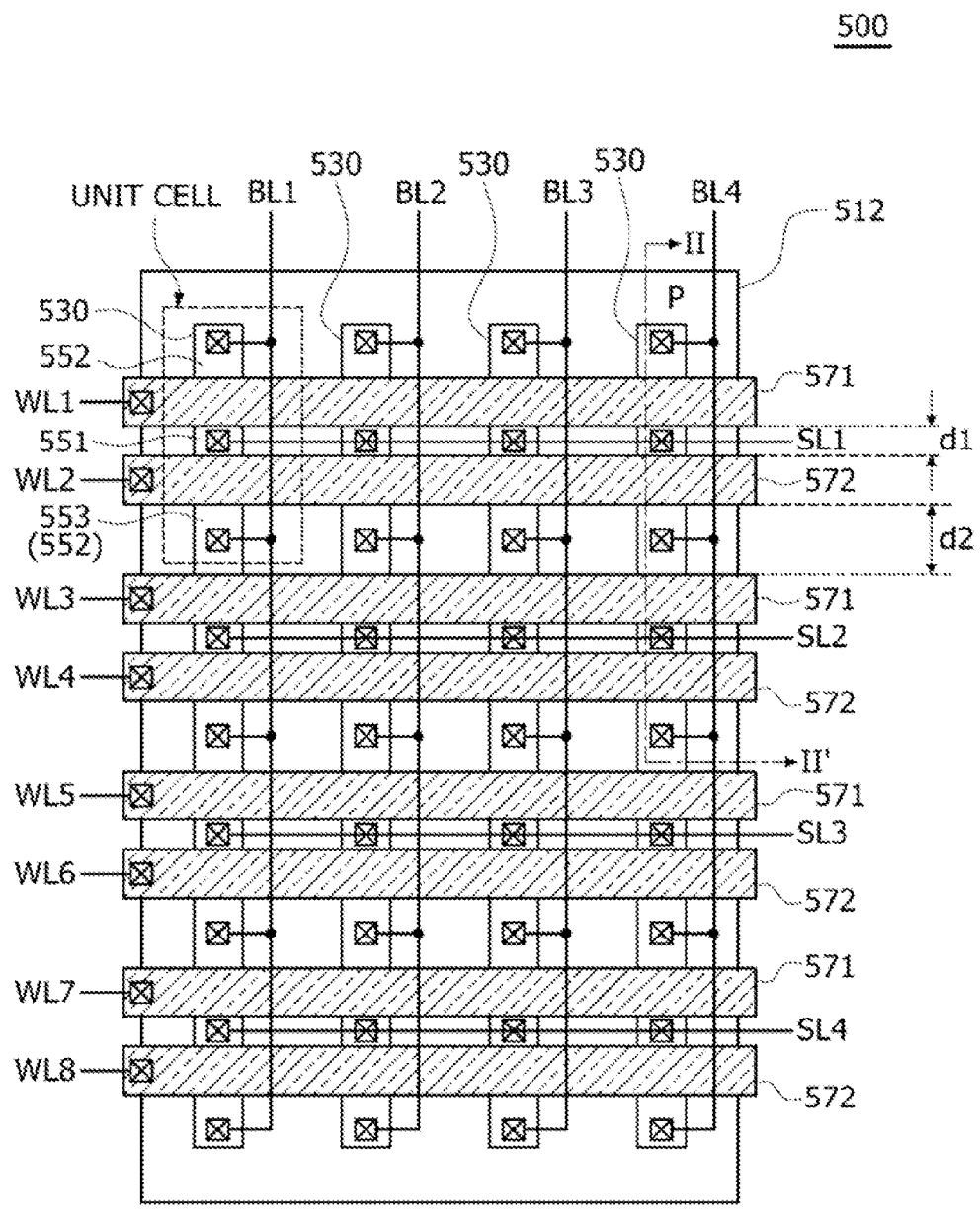
FIG. 19 is a layout diagram illustrating a cell array of a nonvolatile memory device according to an embodiment.

FIG. 19 is a layout diagram illustrating a cell array 500 of a nonvolatile memory device according to an embodiment. Referring to FIG. 19, the cell array 500 may include a plurality of active regions 530 which are disposed in a P-type well region 512. Each of the active regions 530 may extend in a bit line direction and have a stripe shape. The active regions 530 may be spaced apart from each other in the word line direction. In addition, the cell array 500 may include a plurality of first control gate layers 571 and a plurality of second control gate layers 572 that intersect the active regions 530. Each of the first and second control gate layers 571 and 572 may extend in a word line direction and have a stripe shape. The first control gate layers 571 and the second control gate layers 572 may be alternately disposed along the bit line direction. The first control gate layers 571 may be electrically connected to odd-numbered word lines WL1, WL3, WL5 and WL7 through contacts, respectively. The second control gate layers 572 may be electrically connected to even-numbered word lines WL2, WL4, WL6 and WL8 through contacts, respectively.

Each of the active regions 530 may include first N-type junction regions 551, second N-type junction regions 552 and third N-type junction regions 553. As illustrated in FIG. 19, a unit cell may be configured to include the pair of adjacent word lines, such as, the word line WL1 and the word line WL2, the first N-type junction region 551 between the word lines WL1 and WL2, the second N-type junction region 552 located at one side of the word line WL1 opposite to the first N-type junction region 551, and the third N-type junction region 553 located at one side of the word line WL2 opposite to the first N-type junction region 551. The unit cell may have substantially the same configuration as the unit cell 100 described with reference to FIG. 1. Thus, tunneling layers, charge trap layers and insulation layers covering bottom surfaces and sidewalls of the first and second control gate layers 571 and 572 are not illustrated in FIG. 19, to avoid overcomplicating the drawing. The unit cells arrayed in a single row parallel with the word line direction may share the first control gate layer 571 and the second control gate layer 572, which are adjacent to each other. In addition, a pair of adjacent unit cells arrayed in a single column parallel with the bit line direction may be disposed to share the third N-type junction region 553. The third N-type junction region 553 of a first unit cell of the pair may act as the second N-type junction region 552 of the other unit cell of the pair.

The second N-type junction regions 552 and the third N-type junction regions 553 of the unit cells arrayed in a single column may be electrically connected to one of the bit lines BL1, BL2, BL3 and BL4. The distance D1 between the first and second control gate layers 571 and 572, which are disposed in each unit cell, may be less than a distance D2 between the first control gate layer 571 of one of the pair of unit cells which are adjacent to each other along the bit line direction and the second control gate layer 572 of the other of the pair of adjacent unit cells. Although FIG. 19 illustrates an example in which the unit cells are arrayed to have a "4×4" matrix form, the embodiment is not limited thereto. For example, in some embodiments, the unit cells may be arrayed to have an "(m/2)×n" matrix form, as illustrated in FIG. 14. Program operations, erasure operations and read operations of the unit cell array 500 shown in FIG. 19 may be the same as those discussed with reference to FIGS. 15, 16, 17 and 18.

FIGS. 20, 21, 22 and 23 are cross-sectional views illustrating a method of fabricating a nonvolatile memory device according to an embodiment. FIGS. 20, 21, 22 and 23 are cross-sectional views taken along a line II-II' of FIG. 19 at different stages of the fabrication process.

Figure 20:
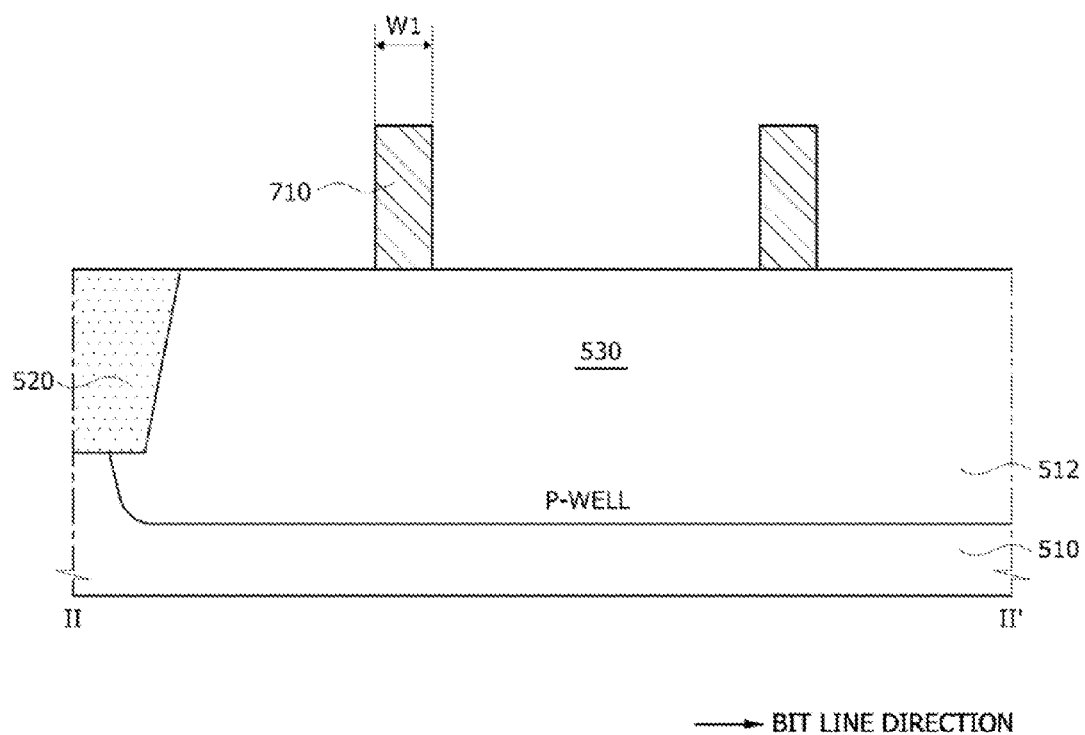
FIG. 20 is a cross-sectional view illustrating a method of fabricating a nonvolatile memory device according to an embodiment.

Referring to FIG. 20, a P-type well region 512 may be formed in a substrate 510 such that a top surface of the P-type well region 512 is exposed. A trench isolation layer 520 may be formed in the substrate 510 to define an active region 530 in the P-type well region 512. If a P-type substrate is used as the substrate 510, the process for forming the P-type well region 512 may be omitted. A pair of fence patterns 710 may be formed on the active region 530. Each of the fence patterns 710 may be formed to have a width W1, as measured in a bit line direction. The width W1 may correspond to the distance D1 between the first and second control gate layers 571 and 572 illustrated in FIG. 19. The fence patterns 710 may be formed to have stripe shapes which are parallel with a word line direction and perpendicular to the bit line direction. In some embodiments, the fence patterns 710 may be formed of a nitride material.

Figure 21:
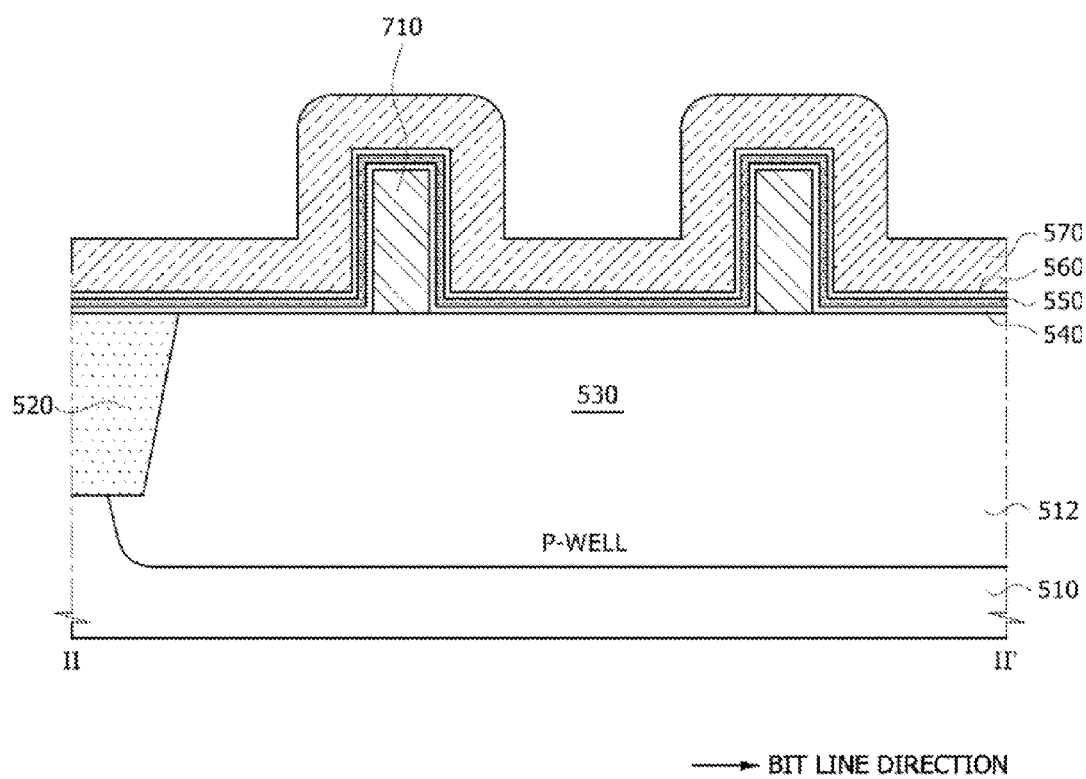
FIG. 21 is a cross-sectional view illustrating a method of fabricating a nonvolatile memory device according to an embodiment.

Referring to FIG. 21, a tunneling layer 540, a charge trap layer 550 and an insulation layer 560 may be sequentially formed on the resultant structure on which the fence patterns 710 are formed. The tunneling layer 540 may be formed of an insulation material, for example, an oxide material. The charge trap layer 550 may be formed of a charge trap material, for example, a nitride material. The insulation layer 560 may be formed of an oxide material. A control gate layer 570 may be formed on the insulation layer 560. The control gate layer 570 may be formed of a conductive material, for example, a doped polysilicon material.

Figure 22:
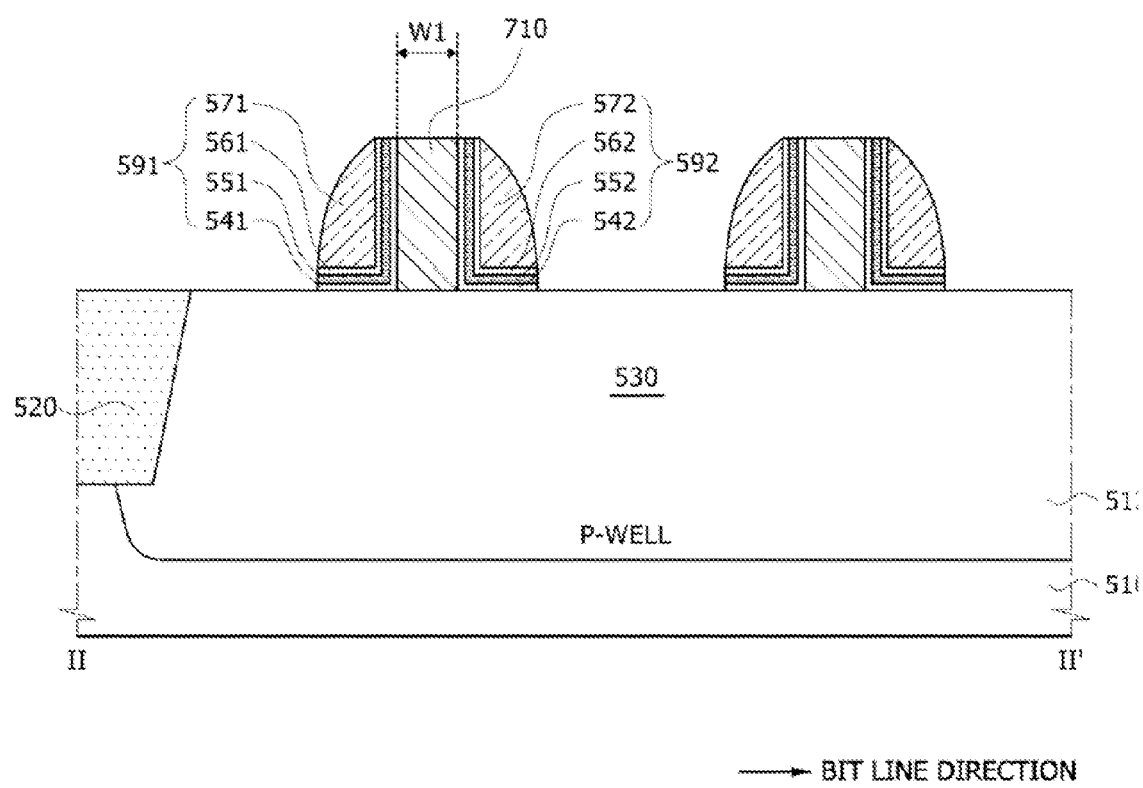
FIG. 22 is a cross-sectional view illustrating a method of fabricating a nonvolatile memory device according to an embodiment.

Referring to FIG. 22, the control gate layer 570, the insulation layer 560, the charge trap layer 550 and the tunneling layer 540 may be anisotropically etched to form a first charge trap pattern 591 and a second charge trap pattern 592 on both sidewalls of each fence pattern 710, respectively. In some embodiments, the control gate layer 570, the insulation layer 560, the charge trap layer 550 and the tunneling layer 540 may be anisotropically etched using an etch-back process. The etch-back process may be performed until a top surface of the substrate 510 and top surfaces of the fence patterns 710 are exposed. The first charge trap pattern 591 may be formed to include a first tunneling layer 541, a first charge trap layer 551, a first insulation layer 561 and a first control gate layer 571. The second charge trap pattern 592 may be formed to include a second tunneling layer 542, a second charge trap layer 552, a second insulation layer 562 and a second control gate layer 572. Each of the first and second control gate layers 571 and 572 may be formed to have a spacer shape.

Figure 23:
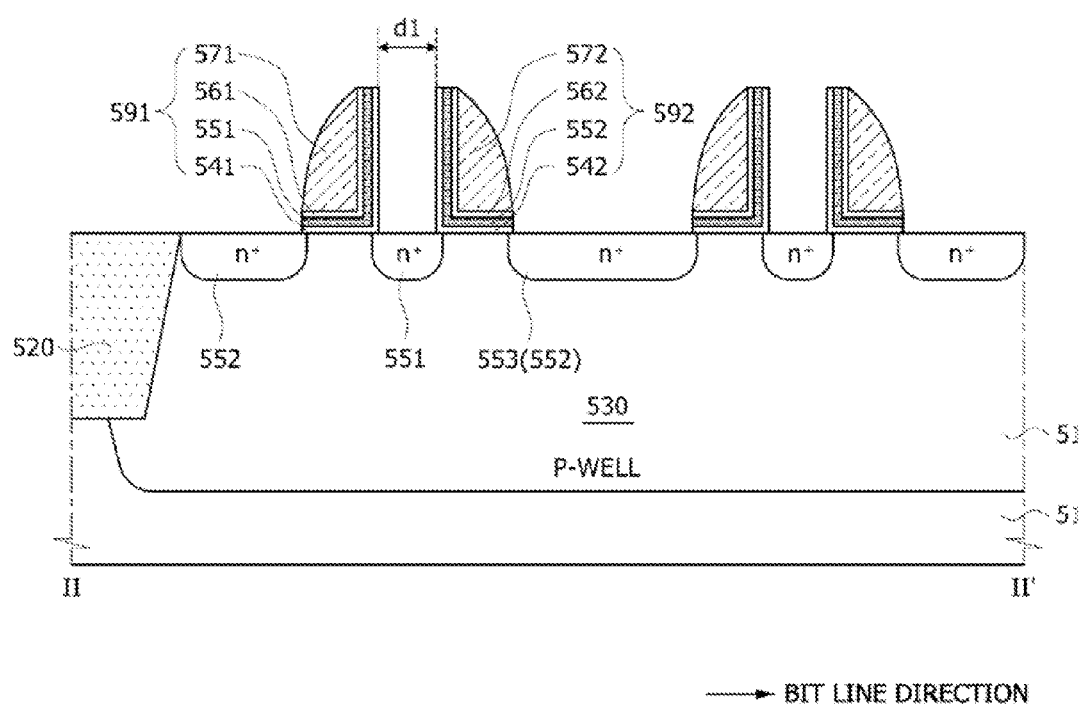
FIG. 23 is a cross-sectional view illustrating a method of fabricating a nonvolatile memory device according to an embodiment.

Referring to FIG. 23, the fence patterns (710 of FIG. 22) may be removed after the first and second control gate layers 571 and 572 are formed. Impurity ions may then be implanted into the active region 530 using the first and second control gate layers 571 and 572 as implantation masks, thereby forming first N-type junction regions 551, second N-type junction regions 552 and third N-type junction regions 553. In some embodiments, each of the first, second and third N-type junction regions 551, 552 and 553 may be formed to have an lightly doped drain (LDD) structure. Each of the first N-type junction regions 551 may be formed in the active region 530 under a gap region between the first and second charge trap patterns 591 and 592. Each of the second N-type junction regions 552 may be formed in the active region 530 adjacent to the first control gate layer 571 and opposite to the first N-type junction region 551. Each of the third N-type junction regions 553 may be formed in the active region 530 adjacent to the second control gate layer 572 and opposite to the first N-type junction region 551. The third N-type junction region 553 of a first unit cell may correspond to the second N-type junction region 552 of a second unit cell adjacent to the first unit cell.

Although not shown in the drawings, metal silicide layers may be selectively formed on the first, second and third N-type junction regions 551, 552 and 553 as well as on the first and second control gate layers 571 and 572. Subsequently, contacts may be formed on the metal silicide layers.

A distance D1 between the first and second charge trap patterns 591 and 592 in each unit cell may be substantially equal to the width W1 of each fence pattern (710 of FIG. 22). That is, the distance D1 between the first and second charge trap patterns 591 and 592 in each unit cell may be controlled by adjusting the width W1 of each fence pattern 710. Moreover, the width of each of the first and second control gate layers 571 and 572 in the bit line direction may be determined by a thickness of the control gate layer (570 of FIG. 21). Thus, no photolithography process is required to form fine patterns of the first and second control gate layers 571 and 572.

The embodiments of the inventive concept have been disclosed above for illustrative purposes. Those of ordinary skill in the art will appreciate that various modifications, additions and substitutions are possible, without departing from the scope and spirit as disclosed in the accompanying claims.

What is claimed is:

1. A unit cell of a nonvolatile memory device, the unit cell comprising:
   a substrate having an active region;
   a first charge trap pattern disposed on the substrate to intersect the active region;
   a second charge trap pattern disposed on the substrate to intersect the active region and spaced apart from the first charge trap pattern;
   a first junction region disposed in the active region between the first and second charge trap patterns;
   a second junction region disposed in the active region adjacent to one side of the first charge trap pattern opposite to the second charge trap pattern and spaced apart from the first junction region by a first planar channel region; and
   a third junction region disposed in the active region adjacent to one side of the second charge trap pattern opposite to the first charge trap pattern and spaced apart from the first junction region by a second planar channel region,
   wherein the first charge trap pattern includes a first tunneling layer, a first charge trap layer, a first insulation layer and a first control gate layer which are sequentially stacked,
   wherein the first planar channel region between the first junction region and the second junction region is entirely overlapped with the first charge trap layer,
   wherein the second charge trap pattern includes a second tunneling layer, a second charge trap layer, a second insulation layer and a second control gate layer which are sequentially stacked, and wherein the second planar channel region between the first junction region and the third junction region is entirely overlapped with the second charge trap layer.

2. The unit cell of claim 1, further comprising a well region having a first conductivity type,
wherein the well region is disposed in the substrate to surround sidewalls and a bottom surface of the active region.

3. The unit cell of claim 2, wherein the first, second and third junction regions have a second conductivity type which is opposite to the first conductivity type.

4. The unit cell of claim 3, wherein the first conductivity type is a P-type and the second conductivity type is an N-type.

5. The unit cell of claim 1, wherein the first tunneling layer, the first charge trap layer and the first insulation layer extend onto a first sidewall of the first control gate layer.

6. The unit cell of claim 5, wherein the first sidewall of the first control gate layer is adjacent to the first junction region and is opposite to the second junction region.

7. The unit cell of claim 1, wherein the second tunneling layer, the second charge trap layer and the second insulation layer extend onto a first sidewall of the second control gate layer.

8. The unit cell of claim 7, wherein the first sidewall of the second control gate layer is adjacent to the first junction region and is opposite to the third junction region.

9. The unit cell of claim 1, wherein top surfaces of the first and second planar channel regions are substantially coplanar with top surfaces of the first, second and third junction regions.

10. The unit cell of claim 1,
wherein the first charge trap pattern, the second charge trap pattern and the first junction region are electrically connected to a first word line, a second word line and a source line, respectively; and
wherein the second and third junction regions are electrically connected to a bit line.

11. The unit cell of claim 1, wherein each of the first and second charge trap patterns extends in a first direction to have a stripe shape.

12. The unit cell of claim 11, wherein a width of the first junction region, measured in a second direction intersecting the first direction, is less than widths of the second and third junction regions, measured in the second direction.

13. A cell array of a nonvolatile memory device, the cell array comprising:

a plurality of bit lines extending in a bit line direction;
a plurality of word lines including odd-numbered word lines and even-numbered word lines that extend in a word line direction intersecting the bit line direction;
a plurality of source lines extending in the word line direction; and
a plurality of unit cells disposed at intersections of the bit lines and the source lines, respectively,
wherein each of the unit cells includes a first charge storage transistor and a second charge storage transistor that are connected in series along the bit line direction to share a first junction region,
wherein each of the first charge storage transistors includes a first control gate layer, the first junction region and a second junction region, and each of the second charge storage transistors includes a second control gate layer, the first junction region and a third junction region,
wherein the first control gate layer and the second control gate layer of each of the unit cells are electrically connected to one of the odd-numbered word lines and one of the even-numbered word lines, respectively,
wherein the second junction region and the third junction region of each of the unit cells are electrically connected to one of the bit lines,
wherein the first junction region of each of the unit cells is electrically connected to one of the source lines.

14. The cell array of claim 13,
wherein each of the first charge storage transistors further includes a first charge trap layer and each of the second charge storage transistors further includes a second charge trap layer;
wherein the first charge trap layer includes a first region and a second region and the second charge trap layer includes a third region and a fourth region; and
wherein charges are independently and locally trapped in the first, second, third or fourth region during a program operation, and a datum stored in the first, second, third or fourth region is independently read out during a read operation.

15. The cell array of claim 14,
wherein the first region and the second region of the first charge trap layer are adjacent to the second junction region and the first junction region, respectively;
wherein the third region and the fourth region of the second charge trap layer are adjacent to the third junction region and the first junction region, respectively.

* * * * *